(12) United States Patent  
Nakahira

(10) Patent No.: US 7,116,161 B2  
(45) Date of Patent: Oct. 3, 2006

(54) DIFFERENTIAL AMPLIFIER CIRCUIT AND DRIVE CIRCUIT OF LIQUID CRYSTAL DISPLAY UNIT USING THE SAME

(75) Inventor: Yoshihiko Nakahira, Tokyo (JP)

(73) Assignees: NEC Corporation, (JP); NEC Electronics Corporation, (JP)

( * ) Notice: Subject to any disclaimer, the term of this patent is extended or adjusted under 35 U.S.C. 154(b) by 59 days.

(21) Appl. No.: 10/939,369

(22) Filed: Sep. 14, 2004

(65) Prior Publication Data

US 2005/0073358 A1   Apr. 7, 2005

(30) Foreign Application Priority Data

Oct. 1, 2003   (JP)   ............... 2003/342745

(51) Int. Cl.
*H03F 1/02* (2006.01)
(52) U.S. Cl. .......................... 330/9; 327/124
(58) Field of Classification Search ............ 330/9, 330/51, 327, 124
See application file for complete search history.

(56) References Cited

U.S. PATENT DOCUMENTS 4,392,112 A * 7/1983 Schade, Jr. .............. 330/9
4,429,282 A * 1/1984 Saari ....................... 330/9

FOREIGN PATENT DOCUMENTS

JP   HEI 09-244590   9/1997

* cited by examiner

*Primary Examiner*—Khanh Van Nguyen
(74) *Attorney, Agent, or Firm*—Dickstein, Shapiro, LLP.

(57) ABSTRACT

Even when an input is small in a current supply capacity, a differential amplifier circuit capable of outputting a high accurate voltage with an offset corrected can be obtained. In the differential amplifier having first and second input terminals and an output terminal, a control is made for switching between a first state wherein a first input terminal is taken as a non-inverting input terminal, and a second input terminal is taken as an inverting input terminal, and a second state wherein the first input terminal is taken as an inverting input terminal and the second input terminal is taken as a non-inverting input terminal, and further, a capacity element, one end of which is connected to a predetermine power source terminal, is provided, and moreover, a control is made such that the first input terminal is supplied with an input voltage, and the other end of the capacity is connected to the second input terminal and output terminal in the first state, and the first input terminal is connected to the output terminal, and the other end of the capacity is connected to the second input terminal in the second state. In this way, an offset detecting operation is performed in the first state, and an offset correcting operation is performed in the second state without the input voltage connected to the capacity.

11 Claims, 21 Drawing Sheets

US 7,116,161 B2

DIFFERENTIAL AMPLIFIER CIRCUIT AND DRIVE CIRCUIT OF LIQUID CRYSTAL DISPLAY UNIT USING THE SAME

BACKGROUND OF THE INVENTION

1. Field of the Invention

The present invention relates to a differential amplifier circuit and a drive circuit of a liquid crystal display unit using the same, and more in particular, it relates to improvement of the differential amplifier circuit which is removed from an offset in order to drive a load with a high degree of accuracy.

2. Description of the Prior Art

Heretofore, there has been a problem of the differential amplifier circuit for driving a load developing an output offset because of variation in characteristics of active elements configuring the differential amplifier circuit. To solve this problem, there have been various methods employed so far to correct the output offset. From among those methods, the differential amplifier circuit as disclosed in Japanese Patent Laid-Open No. 9-244590 (patent document 1) is cited as an example of the differential amplifier circuit of a first conventional example having an output offset correcting means using a capacitance.

FIG. 19 is a view showing the differential amplifier circuit of a first conventional example having the output offset correcting means as disclosed in this patent document 1. The differential amplifier circuit of FIG. 19 comprises an operational amplifier circuit 503 and an offset correcting circuit 504. The offset correcting circuit 504 comprises switches 506 and 507 connected in series between a non-inverting input terminal of the operational amplifier circuit 503 and an output terminal 502 of the operational amplifier circuit 503, a capacitor 505 connected between a mutual connecting point of the switches 506 and 507 and an inverting input terminal of the operational amplifier circuit 503, and a switch 508 connected between the inverting input terminal of the operational amplifier circuit 503 and the output terminal 502 of the operational amplifier circuit 503.

FIG. 20 shows an operational timing chart of the differential amplifier circuit of FIG. 19. The operation of the differential amplifier circuit of FIG. 19 will be described below with reference to the timing chart of FIG. 20. First, in the period T1 which is a proceeding state, the switch 507 alone is put into an ON state, and other switches 506 and 508 are put into an OFF state. This allows the output terminal 502 and the inverting input terminal of the operational amplifier circuit 503 to be connected through the capacitor 505. In this state, the preceding output voltage carries over the voltage level of an output voltage Vout.

In the next period T2, in addition to the switch 507, the switch 508 is turned ON. When the voltage level of the input voltage Vin changes, the output voltage Vout changes accordingly, and becomes (Vin+Voff) including an output offset Voff. At this time, the capacitor 505 is short-circuited, and both ends of the capacitor 505 become the same potential. Further, by turning the switches 507 and 508 ON, the both ends of the capacitor 505 are connected to the output terminal 502 of the operational amplifier circuit, and therefore, the potentials of both ends of the capacitor 505 become Vout (=Vin+Voff) by the output of the operational amplifier circuit, respectively.

In the next period T3, while the switch 508 is turned ON as it is, the switch 507 is turned OFF, and after that, the switch 506 is turned ON. This allows one end of the capacitor 505 to be connected to an input terminal 501 and change from Vout to Vin. Since the switch 508 is turned ON, the other terminal of the capacitor 505 remains the output voltage Vout. Hence, the voltage applied to the capacitor 505 becomes as follows $$Vout-Vin=Vin+Voff-Vin=Voff$$

and a charge equivalent to the offset voltage Voff is charged to the capacitor 505.

In the next period T4, the switches 506 and 508 are turned OFF, and after that, the switch 507 is turned ON. By turning the switches 506 and 508 OFF, the capacitor 505 is directly connected between the inverting input terminal and the output terminal 502 of the operational amplifier circuit 503, and the output offset Voff is held by the capacitor 505. By turning the switch 507 ON, the output offset Voff is applied to the inverting input terminal of the operational amplifier circuit 503 with the potential of the output terminal 502 as a reference. As a result, the output voltage Vout becomes as follows $$Vout=Vin+Voff-Voff=Vin$$

and therefore, the output offset is canceled, and a highly precise voltage can be outputted.

Next, as a second conventional example for correcting the output offset, amplifier circuits as disclosed in Japanese Patent Laid-Open Nos. 11-249624 (patent document 2) and 11-305735 (patent document 3) are cited. FIG. 21 is a circuit diagram showing a basic circuit configuration of a low voltage amplifier circuit shown in the patent document 2, and FIG. 22 is a circuit diagram showing the basic circuit configuration of a high voltage amplifier circuit as similarly disclosed in the patent document 2.

The low voltage amplifier circuit shown in FIG. 21 is provided with switching transistors NA1 and NB1 which connects the gate electrode (control electrode) of a P channel (hereinafter, referred to simply as P) MOS transistor PM51 of an input stage to either a (+) input terminal or a (−) input terminal, switching transistors NA2 and NB2 which connects the gate electrode of the PMOS transistor PM52 of the input stage to the (+) input terminal or the (−) input terminal, switching transistors NA3 and NB3 which connects the gate electrode of a N channel (hereinafter, referred to simply as N) MOS transistor NM65 of an output stage to either the drain electrode (second electrode) of the PMOS transistor PM51 of the input stage or the drain electrode of the PMOS transistor PM52 of the input stage, and switching transistors NA4 and NB4 which connects the gate electrodes of the NMOS transistors NM63 and NM64 configuring an active load circuit to either the drain electrode of the PMOS transistor PM51 of the input stage or the drain electrode of the PMOS transistor PM52 of the input stage.

A high voltage amplifier circuit shown in FIG. 22, similarly to the low voltage amplifier circuit shown in FIG. 21, is provided with switching transistors PA1 to PA4 and PB1 to PB4. Here, the gate electrodes of switching transistors NA1 to NA4 and PA1 to PA4 are applied with a control signal A, and the gate electrodes of switching transistors NB1 to NB4 and PB1 to PB4 are applied with a control signal B.

In the low voltage amplifier circuit shown in FIG. 21, a circuit configuration is shown in FIG. 23 where the control signal A is at a H (high) level and the control signal B is at a L level, and a circuit configuration is shown in FIG. 24 where the control signal A is at a L (low) level and the control signal B is at an H level. As evident from these FIGS. 23 and 24, in case of the low voltage amplifier circuit, the MOS transistor of the input stage applied with the input voltage Vin and the MOS transistor of the input stage fed back with the output voltage Vout are exchangeable. Consequently, in the cases of the circuit configuration of FIG. 23 and the circuit configuration of FIG. 24, an output offset is generated in the amplifier circuit where reference numerals are in reverse to one another and the absolute values thereof are equal.

Further, in the high voltage amplifier circuit shown in FIG. 22 also, in the cases of the circuit configuration where the control signal A is at the H level and the control signal B is at the L level and the circuit configuration where the control signal A is at the L level and the control signal B is at the H level, the output offset is generated in the amplifier circuit where reference characters are in reverse to one another and the absolute values thereof are equal.

It is disclosed in the circuit configuration of the patent document 2 that, in an image signal line driving means of the liquid crystal display unit for performing a dot inversion driving, to apply a gradation voltage to a piece of pigment, a high voltage side amplifier circuit for outputting a positive polarity gradation voltage and a low voltage side amplifier circuit for outputting a negative polarity gradation voltage are alternately operated for every frame in response to the polarity, and an operation of alternately changing the MOS transistor of the input stage applied with the input voltage of the amplifier circuit and the MOS transistor of the input stage fed back with the output voltage for every two frames is performed, whereby the output offset generated for each amplifier circuit is equalized for every four frames timewise. By so doing, the increase and decrease of brightness generated by variation of a voltage applied to the pigment by the output offset is prevented.

BRIEF SUMMARY OF THE INVENTION

When a differential amplifier circuit is configured, for example, by using polycrystalline silicon thin film transistor having a large elemental variation, a large output offset is generated. According to the conventional example of FIG. 19 shown in the patent document 1, when the output offset of the differential amplifier circuit is large and the current supply capacity of the input voltage Vin supplied to the input terminal is low, there often develops an oscillating state by forming a positive feedback when the input terminal and the output terminal are connected through the capacitor in the period T3, and therefore, the output offset cannot be accurately detected. Further, according to the second conventional example shown in the patent document 2, it is not possible to make the output offset itself small.

The present invention has been made in view of the above described problem and it is an object of the invention to provide a differential amplifier circuit and the drive circuit of a liquid crystal display unit using the same, which realize a highly accurate voltage output corrected in the offset.

The differential amplifier circuit according to the present invention includes: differential amplifying means having first and second input terminals and an output terminal; a capacity element, one end of which is connected to a predetermined power source terminal, and the other end of which is connected to the second input terminal; and control means for controlling the switching between a first state wherein the first input terminal is taken as a non-inverting input terminal, and at the same time, the second input terminal is taken as an inverting input terminal, and moreover, the first input terminal is supplied with an input voltage, and at the same time, the second input terminal is connected to the output terminal, and a second state wherein the first input terminal is taken as an inverting input terminal, and at the same time, the second input terminal is taken as a non-inverting input terminal, and moreover, the first input terminal is connected to the output terminal.

Another differential amplifier circuit according to the present invention includes: differential amplifying means having a circuit input terminal and a circuit output terminal, a pair of differential transistors having a first transistor and a second transistor, a constant current source for driving the pair of transistors, an active load connected to a pair of outputs of the pair of transistors, and an output circuit for outputting a signal to the circuit output terminal based on the signal of the pair of outputs; first and second switches for connecting the one of the input pair of the pair of differential transistors and each of the circuit input terminal and the circuit output terminal; a third switch for connecting the other of the input pair and the circuit output terminal; fourth and fifth switches for connecting each of the output pair to the output circuit; and a capacity element, one terminal of which is connected to the predetermined power source terminal and the other end of which is connected to the other end of the input pair.

Further, the differential amplifier circuit includes control means for controlling the switching between the first state wherein the first, third and fourth switches are turned ON, and the second and fifth switches are turned OFF, and the second state wherein the first, third and fourth switches are turned OFF, and the second and fifth switches are turned ON.

The drive circuit of the liquid crystal display unit according to the present invention is a drive circuit of a liquid crystal display unit, which has a plurality of resistors connected in series between first and second reference voltages, and includes gradation generating means for forming a gradation voltage from each tap derived from connecting points of a plurality of these resistors and decoding means for taking a digital signal as an input and selecting and outputting a corresponding voltage from output voltage of the gradation generating means, and takes the output of the decoding means as an input, and drives a plurality of data lines, respectively, wherein a plurality of differential amplifier circuits are provided in correspondence with a plurality of data lines.

The drive circuit of another liquid crystal display unit according to the present invention is a drive circuit of the liquid crystal display unit which includes: a plurality of respective reference voltage input terminals for inputting a plurality of reference voltages; decoding means for selecting and outputting two adjacent reference voltages according to a digital video signal; D/A converting means for interpolating and outputting an analogue voltage of the intermediate level between two reference voltages selected by this decoding means, and takes the output of the D/A converting means as an input, and drives a plurality of data lines, respectively, wherein a plurality of differential amplifier circuits are provided in correspondence with a plurality of data lines.

The operation of the present invention will be described. In the differential amplifier circuit having the first and second input terminals and an output terminal, a control is made for switching between the first state wherein the first input terminal is taken as a non-inverting input terminal and the second input terminal is taken as the inverting input terminal, and the second state wherein the first input terminal is taken as the inverting input terminal, and the second input terminal is taken as the non-inverting input terminal, and moreover, a control is made such that the capacity element, one end of which is connected to the predetermined power source terminal, is provided, and the input voltage is supplied to the first input terminal, and the other end of the capacity is connected to the second input terminal and output terminal in the first state, and the first input terminal and output terminal are connected, and the other end of the capacity is connected to the second input terminal in the second state.

By so doing, the input voltage is not connected to the capacity, and the offset detecting operation is performed in the first state, and the offset correcting operation is performed in the second state and an accurate amplification output which is removed from the offset can be obtained.

DETAILED DESCRIPTION OF THE PREFERRED EMBODIMENTS

Figure 1:
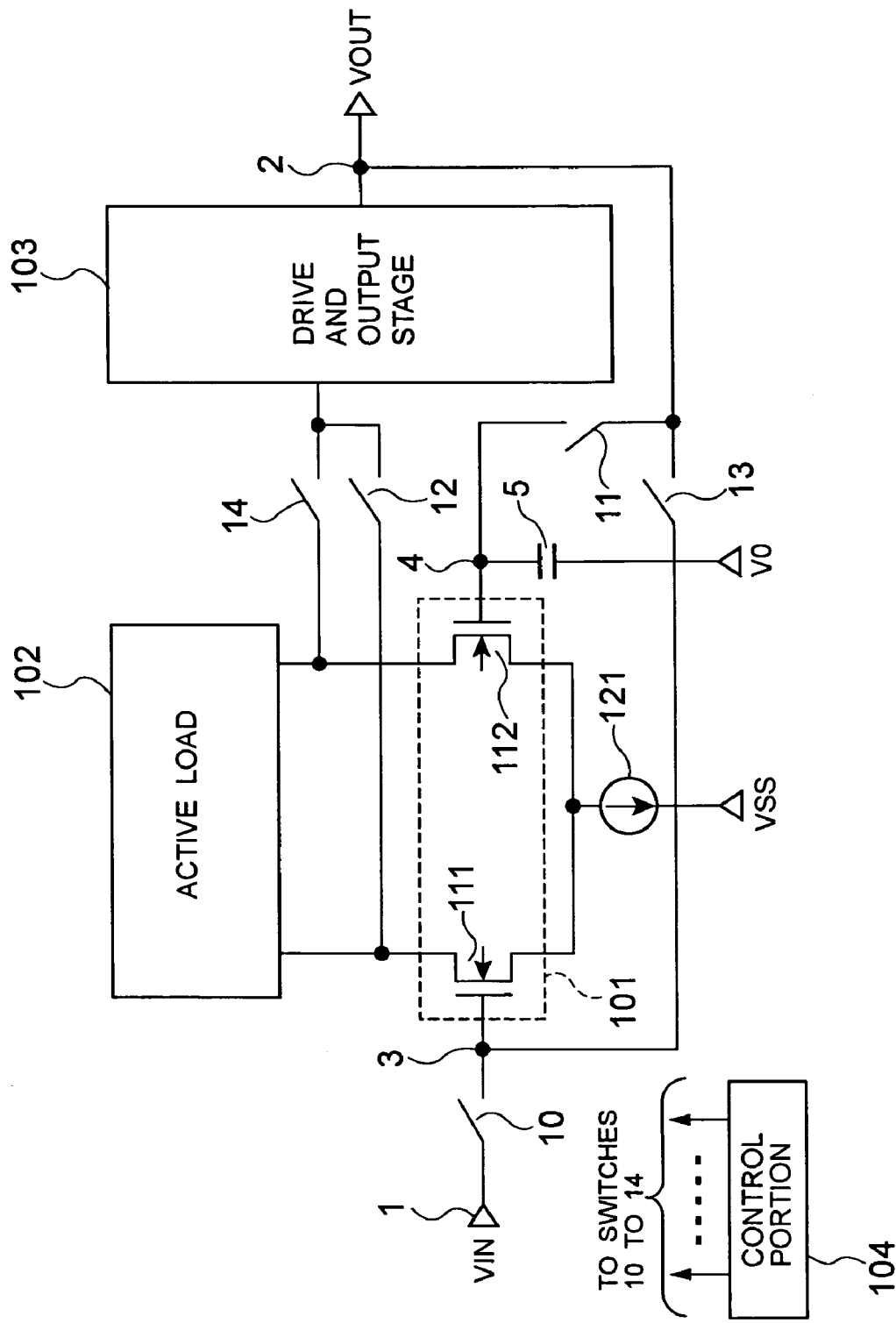
FIG. 1 is a block diagram of a differential amplifier circuit of a first embodiment of the present invention.

Embodiments of the present invention will be described below in detail with reference to the drawings. In the drawings to describe the embodiments of the present invention, the like reference numerals designate the same parts having the same function, and the description thereof will be omitted.

[First Embodiment]

FIG. 1 is a view showing a configuration of a differential amplifier circuit according to a first embodiment of the present invention. The differential amplifier circuit of FIG. 1 is a feedback type operational amplifier circuit having a NMOS differential input portion. The differential amplifier circuit comprises switches 10 to 14 for changing a non-inverting input terminal for an inverting input terminal, and a capacity element 5. There is provided a control portion 104 for controlling these switches 10 to 14.

Referring to FIG. 1, the differential amplifier circuit according to the first embodiment of the present invention comprises: a differential input portion 101 comprising input transistors 111 and 112 with sources thereof commonly connected to each other, a constant current source 121 connected between the sources commonly connected to each other of the transistors 111 and 112 and a low order power source VSS, an active load 102 connected to drains of the input transistors 111 and 112, the switch 10 connecting an input terminal 1 and a gate of the input transistor 111, a capacity element 5 connected between a gate of the input transistor 112 and a power source VO (VO is an arbitrary power source), a drive and output stage 103 connected to an output terminal 2, the switch 11 connecting the output terminal 2 and the gate of the input transistor 112, the switch 13 connecting the output terminal 2 and the gate of the input transistor 111, the switch 12 connecting a drain of the input transistor 111 and the drive and output stage 103, and the switch 14 connecting a drain of the input transistor 112 and the drive and output stage 103.

Figure 2:
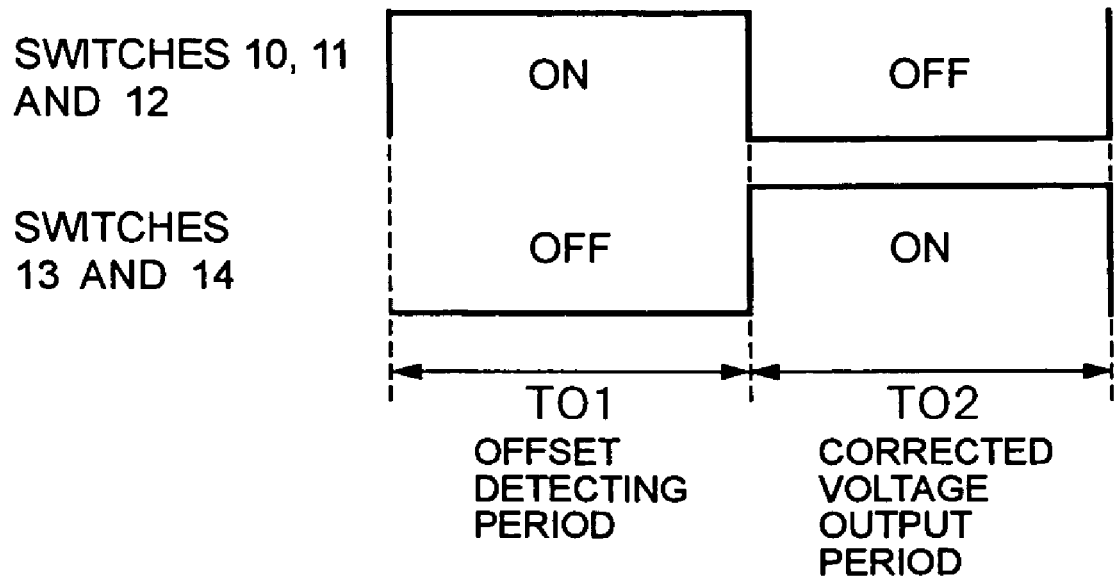
FIG. 2 is a timing chart of switches for showing the operation of the differential amplifier circuit of FIG. 1.

Next, the operation of the differential amplifier circuit of FIG. 1 will be described. FIG. 2 is a timing chart for describing the operation of the differential amplifier circuit of FIG. 1, and shows ON and OFF states of each switch in one output period. The one output period is a period for outputting one signal, and FIG. 2 shows the case where the period is configured by two periods of a first period T01 (offset detecting period) for performing a detection of the output voltage including an output offset and a second period T02 (corrected voltage outputting period) for performing an output of the offset corrected voltage. The control of each switch in these periods is performed in the control portion 104.

Referring to FIG. 2, in the offset detecting period T01, the switches 10 to 12 are turned ON, and the switches 13 and 14 are turned OFF. In this way, the input terminal 1 is connected to the gate (terminal 3) of the input transistor 111, and the output terminal 2 is connected to the gate (terminal 4) of the input transistor 112, and the drain of the input transistor 111 and the drive and output stage 103 are connected, and the terminals 3 and 4 become a non-inverting input terminal and an inverting input terminal, respectively.

Figure 3:
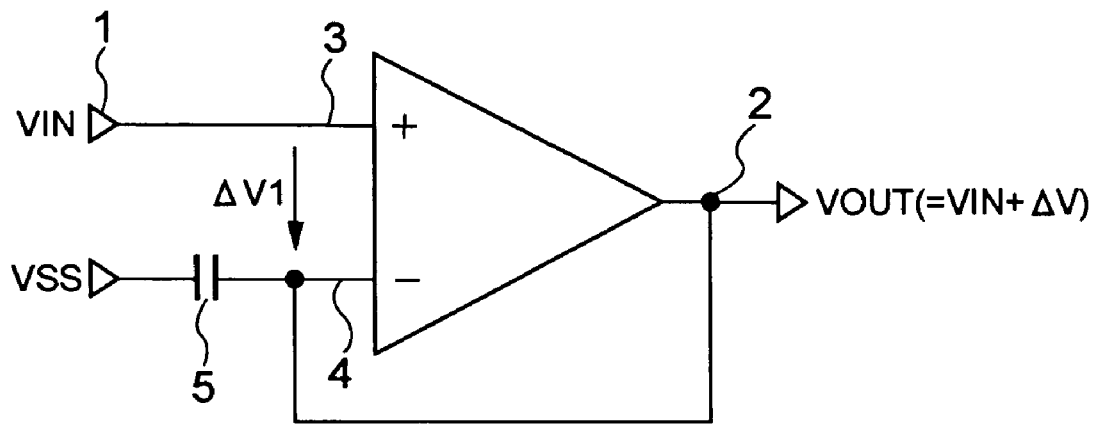
FIG. 3 is a view showing a configuration of the differential amplifier circuit of FIG. 1 in an offset detecting period T01 by using an amplifier symbol.

FIG. 3 shows the circuit configuration at this time by using an amplifier symbol. When the output offset of ΔV1 is generated for an input voltage VIN, the capacity element 5 connected to the terminal 4 is charged by a voltage VOUT (=VIN+ΔV1) added with an offset. Next, in the corrected voltage output period T02, the switches 10 to 12 are changed to OFF, and at the same time, the switches 13 and 14 are changed to ON. In this way, the output terminal 2 is connected to the gate (terminal 3) of the input transistor 111, and the drain of the transistor 112 is connected to the drive and output stage 103, and the terminals 3 and 4 become the inverting input terminal and the non-inverting input terminal, respectively.

Figure 4:
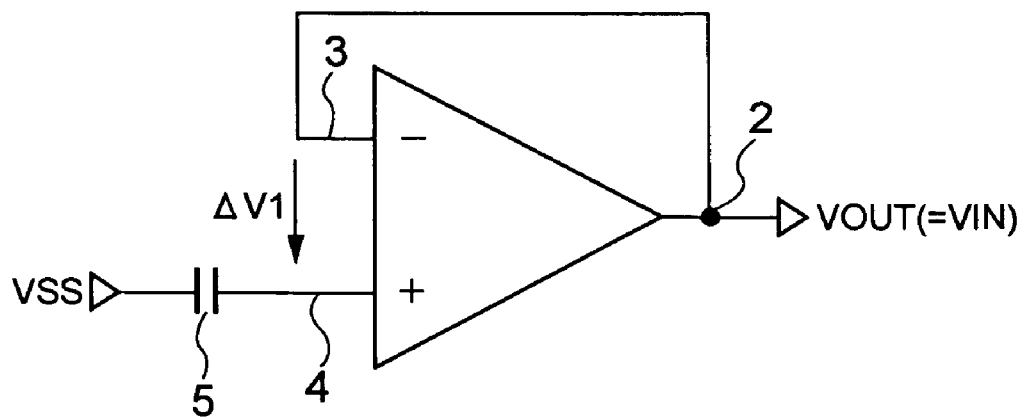
FIG. 4 is a view showing a configuration of the differential amplifier circuit of FIG. 1 in a corrected voltage output period T02 by using an amplifier symbol.

FIG. 4 shows the circuit configuration at this time by using the amplifier symbol. In the period T02, the switch 11 is turned OFF, and therefore, the voltage of the terminal 4 becomes a voltage (=VIN+ΔV1) held by the capacity element 5 in the period T01. When the output offset in T01 is ΔV1 (output voltage VOUT=VIN+ΔV1) for the input voltage VIN, the output offset in T02 becomes −ΔV1 for the voltage of the terminal 4, and therefore, the output voltage in T02 becomes equal to the input voltage VIN.

As described above, in the differential amplifier circuit of the first embodiment of the present invention, a change is made such that the terminals 3 and 4 are taken as the non-inverting input terminal and the inverting input terminal respectively in the offset detecting period T01, and the terminals 3 and 4 are taken as the inverting input terminal and the non-inverting input terminal respectively in the corrected voltage output period T02. Further, the output voltage at the time of applying the input voltage VIN to the terminal 3 in the period T01 is stored in the capacity element, and the voltage stored in the capacity element 5 in the period T01 is used as the voltage of the terminal 4 in the period T02. In this way, when the output offset in T01 is ΔV1 for the voltage (input voltage VIN) of the terminal 3, the output offset in T02 becomes −ΔV1 for the voltage (=VIN+ΔV1) of the terminal 4, and therefore, the output voltage equal to the input voltage VIN can be obtained in T02.

Figure 19:
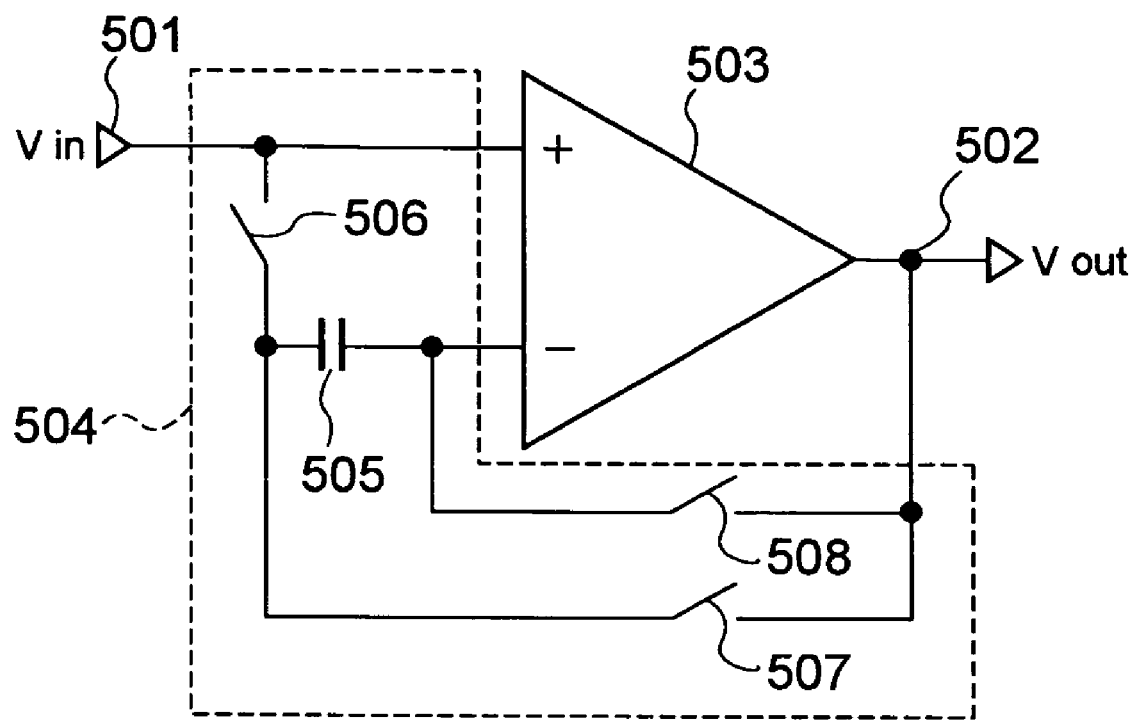
FIG. 19 is a block diagram of the differential amplifier circuit of a first conventional example.

Further, in the differential amplifier circuit of the present embodiment, since the input voltage VIN is connected only to the gate of the input transistor in the period T01, the input voltage VIN is not affected by the output similarly to the differential amplifier circuit of the first conventional example of FIG. 19, and a highly accurate output voltage corrected in the offset can be obtained regardless of the current supply capacity of the input voltage VIN.

[Second Embodiment]

Figure 5:
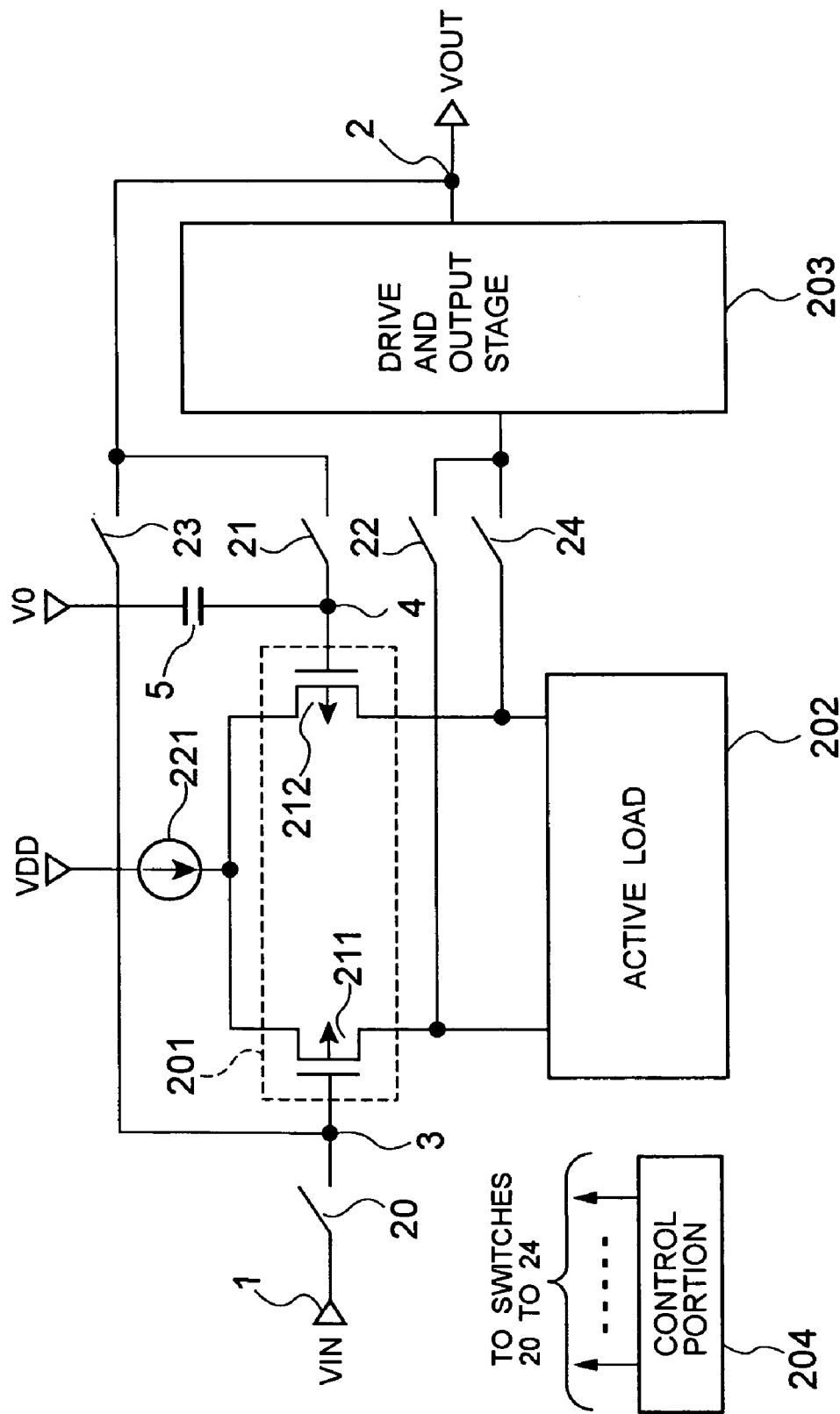
FIG. 5 is a block diagram of the differential amplifier circuit of a second embodiment of the present invention.

Next, a second embodiment of the present invention will be described. FIG. 5 shows a configuration of a differential amplifier circuit according to the second embodiment of the present invention. The differential amplifier circuit of FIG. 5 has a feedback type operational amplifier circuit having a PMOS differential amplifier input portion. The differential amplifier circuit comprises switches 20 to 24 for changing a non-inverting input terminal for an inverting input terminal, and a capacity element 5. There is provided a control portion 104 for controlling the switches 20 to 24.

Referring to FIG. 5, the differential amplifier circuit according to the second embodiment of the present invention comprises: a differential input portion 201 comprising input transistors 211 and 212 with sources thereof commonly connected to each other, a constant current source 221 connected between the sources commonly connected to each other of transistors 211 and 212 and a high order power source VDD, an active load 202 connected to drains of the input transistors 211 and 212, a switch 20 connecting an input terminal 1 and a gate of the input transistor 211, a capacity element 5 connected between a gate of the input transistor 212 and a power source VO (VO is an arbitrary power source), a drive and output stage 203 connected to an output terminal 2, a switch 21 connecting the output terminal 2 and the gate of the input transistor 212, a switch 23 connecting the output terminal 2 and the gate of the input transistor 211, a switch 22 connecting a drain of the input transistor 211 and the drive and output stage 203, and a switch 24 connecting the drain of the input transistor 212 and the drive and output stage 203.

Figure 6:
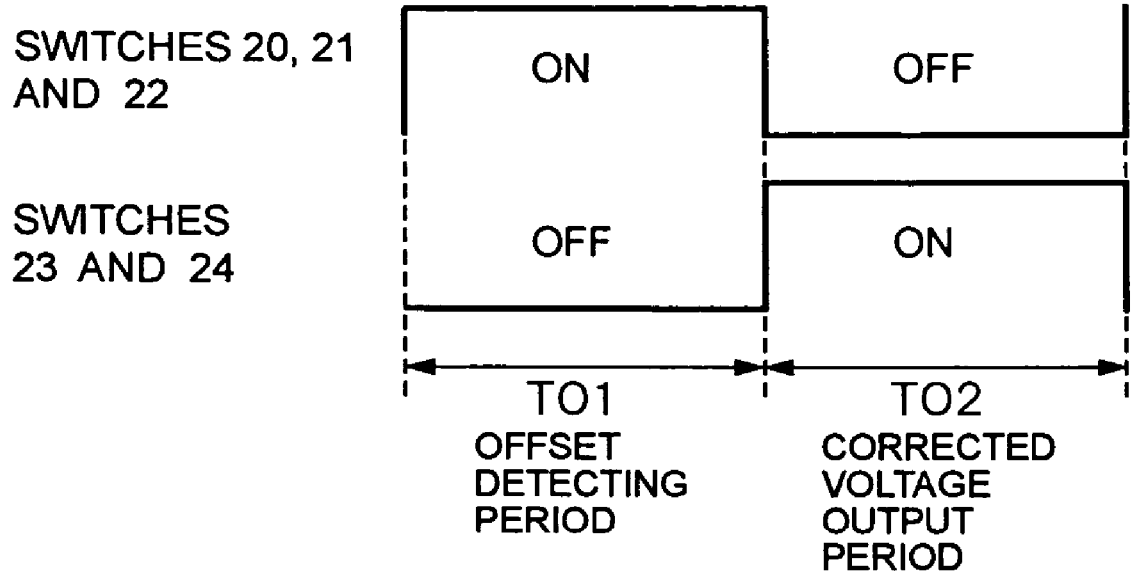
FIG. 6 is a timing chart of switches for showing the operation of the differential amplifier circuit of FIG. 5.

Next, the operation of the differential amplifier circuit of FIG. 5 will be described. FIG. 6 is a timing chart for describing the operation of the differential amplifier circuit of FIG. 5. Referring to FIG. 6, in an offset detecting period T01, the switches 20 to 22 are turned ON, and the switches 23 and 24 are turned OFF. In this way, the input terminal 1 is connected to the gate (terminal 3) of the input transistor 211, and the output terminal 2 is connected to the gate (terminal 4) of the input transistor 212, and the drain of the input transistor 211 is connected to the drive and output stage 203, and the terminals 3 and 4 become a non-inverting input terminal and an inverting input terminal, respectively. When the output offset of ΔV2 is generated for an input voltage, the capacity element 5 connected to the terminal 4 is charged by a voltage VOUT (=VIN+ΔV2) added with an offset.

Next, in a corrected voltage output period T02, the switches 20 to 22 are changed to OFF, and at the same time, the switches 23 and 24 are changed to ON. In this way, the output terminal 2 is connected to the gate (terminal 3) of the input transistor 211, and the drain of the transistor 212 is connected to the drive and output stage 203, and the terminals 3 and 4 become the inverting input terminal and the non-inverting input terminal, respectively.

In the period T02, since the switch 11 is turned OFF, the voltage of the terminal 4 becomes the voltage (=VIN+ΔV2) held by the capacity element 5 in the period T01. When the output offset in T01 is ΔV2 (output voltage VOUT=VIN+ΔV2) for the input voltage VIN, the output offset in T02 becomes −ΔV2 for the voltage of the terminal 4, and therefore, the output voltage in T02 becomes equal to the input voltage VIN.

As described above, in the differential amplifier circuit of the second embodiment of the present invention, similarly to the differential amplifier circuit of FIG. 1, a change is made such that the terminals 3 and 4 are taken as the non-inverting input terminal and the inverting input terminal respectively in the offset detecting period T01, and the terminals 3 and 4 are taken as the inverting input terminal and the non-inverting input terminal respectively in the corrected voltage output period T02. Further, the output voltage at the time of applying the input voltage VIN to the terminal 3 in the period T01 is stored in the capacity element, and the voltage stored in the capacity element 5 in the period T01 is used as the voltage of the terminal 4 in the period T02. In this way, when the output offset in T01 is ΔV2 for the voltage (input voltage VIN) of the terminal 3, the output offset in T02 becomes −ΔV2 for the voltage (=VIN+ΔV2) of the terminal 4, and therefore, the output voltage equal to the input voltage VIN can be obtained in T02.

Further, in the differential amplifier circuit of the present embodiment, since the input voltage VIN is connected only to the gate of the input transistor in the period T01, a highly accurate output voltage corrected in the offset can be obtained regardless of the current supply capacity of the input voltage VIN.

[Third Embodiment]

Figure 7:
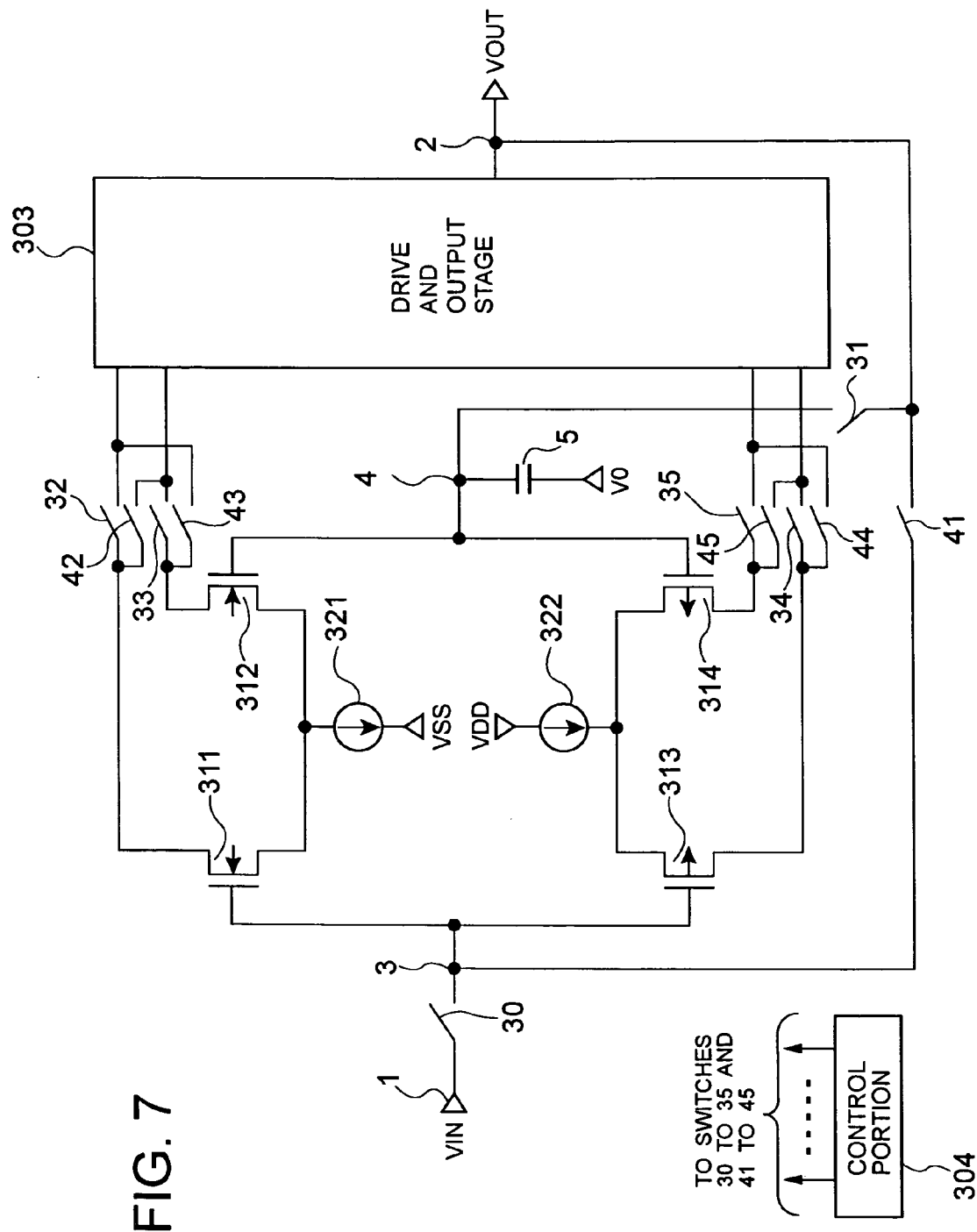
FIG. 7 is a block diagram of the differential amplifier circuit of a third embodiment of the present invention.

Next, a third embodiment of the present invention will be described. FIG. 7 shows the configuration of a differential amplifier circuit of the third embodiment of the present invention. The differential amplifier circuit of FIG. 7 has a feedback type operational amplifier circuit having a NMOS differential input portion and a PMOS differential input portion. The differential amplifier circuit comprises switches 30 to 35 and 41 to 45 for changing a non-inverting input terminal for an inverting input terminal, and a capacity element 5. There is provided a control portion 304 for controlling switches 30 to 35 and 41 and 45.

Referring to FIG. 7, the differential amplifier circuit of the third embodiment of the present invention includes: a NMOS differential input portion comprising input transistors 311 and 312 with sources thereof commonly connected to each other, a constant current source 321 connected between the sources commonly connected to each other of the transistors 311 and 312 and a low order power source VSS, a PMOS differential input portion comprising input transistors 313 and 314, a constant current source 322 connected between the sources commonly connected to each other of the transistors 313 and 314 and a high order power source VDD, the switch 30 connecting the gates commonly connected to each other of the input transistor 311 and 313 and the input terminal 1, and the capacity element 5 connected between the gates commonly connected to each other of the input transistors 312 and 314 and a power source VO (VO is an arbitrary power source).

The differential amplifier circuit of the third embodiment of the present invention further comprises: a drive and output stage 303 connected to an output terminal 2, the switch 31 connecting the output terminal 2 and the gates commonly connected to each other of the input transistors 312 and 314, the switch 41 connecting the output terminal 2 and the gates commonly connected to each other of the input transistors 311 and 313, the switches 32 and 42 connecting a drain of the input transistor 311 and the drive and output stage 303, the switches 33 and 43 connecting a drain of the input transistor 312 and the drive and output stage 303, the switches 34 and 44 connecting a drain of the input transistor 313 and the drive and output stage 303, and the switches 35 and 45 connecting a drain of the input transistor 314 and the drive and output stage 303.

Figure 8:
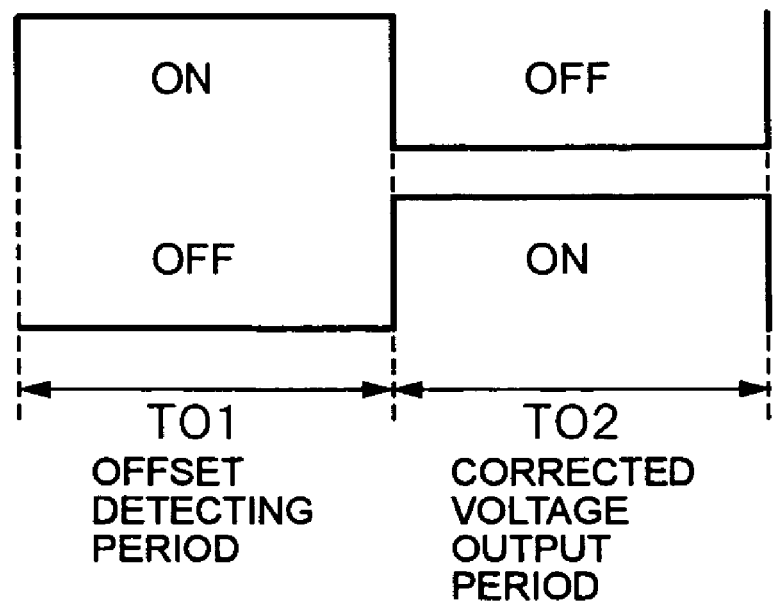
FIG. 8 is a timing chart of switches for showing the operation of the differential amplifier circuit of FIG. 7.

Next, the operation of the differential amplifier circuit shown in FIG. 7 will be described. FIG. 8 is a timing chart describing the operation of the differential amplifier circuit according to the present embodiment. Referring to FIG. 8, in an offset detecting period T01, the switches 30 to 35 are turned ON, and the switches 41 to 45 are turned OFF.

Next, in a corrected voltage output period T02, the switches 30 to 35 are changed to OFF, and at the same time, the switches 41 to 45 are changed to ON. By performing the ON-OFF control of switches in this way, even in the differential amplifier circuit of FIG. 7, similarly to the differential amplifier circuit of FIG. 1, the terminals 3 and 4 are taken as the non-inverting input terminal and the inverting input terminal respectively in an offset detecting period T01, the terminals 3 and 4 are taken as the inverting input terminal and the non-inverting input terminal respectively in the corrected voltage output period T02. Moreover, the output voltage at the time of applying the input voltage VIN to the terminal 3 in the period T01 is stored in the capacity element, and the voltage stored in the capacity element 5 in the period T01 is used as the voltage of the terminal 4 in the period T02.

In this way, when the output offset in T01 is $\Delta V3$ for the voltage (input voltage VIN) of the terminal 3, the output offset in T02 becomes $-\Delta V3$ for the voltage ($=VIN+\Delta V3$) of the terminal 4, and therefore, the output voltage equal to the input voltage VIN can be obtained in T02.

Further, in the differential amplifier circuit of the present embodiment, since the input voltage VIN is connected only to the gate of the input transistor in the period T01, similarly to the differential amplifier circuit of the conventional example of FIG. 19, the input voltage VIN is not affected by the output, and a highly accurate output voltage corrected in the offset can be obtained regardless of the current supply capacity of the input voltage VIN.

[Fourth Embodiment]

Figure 9:
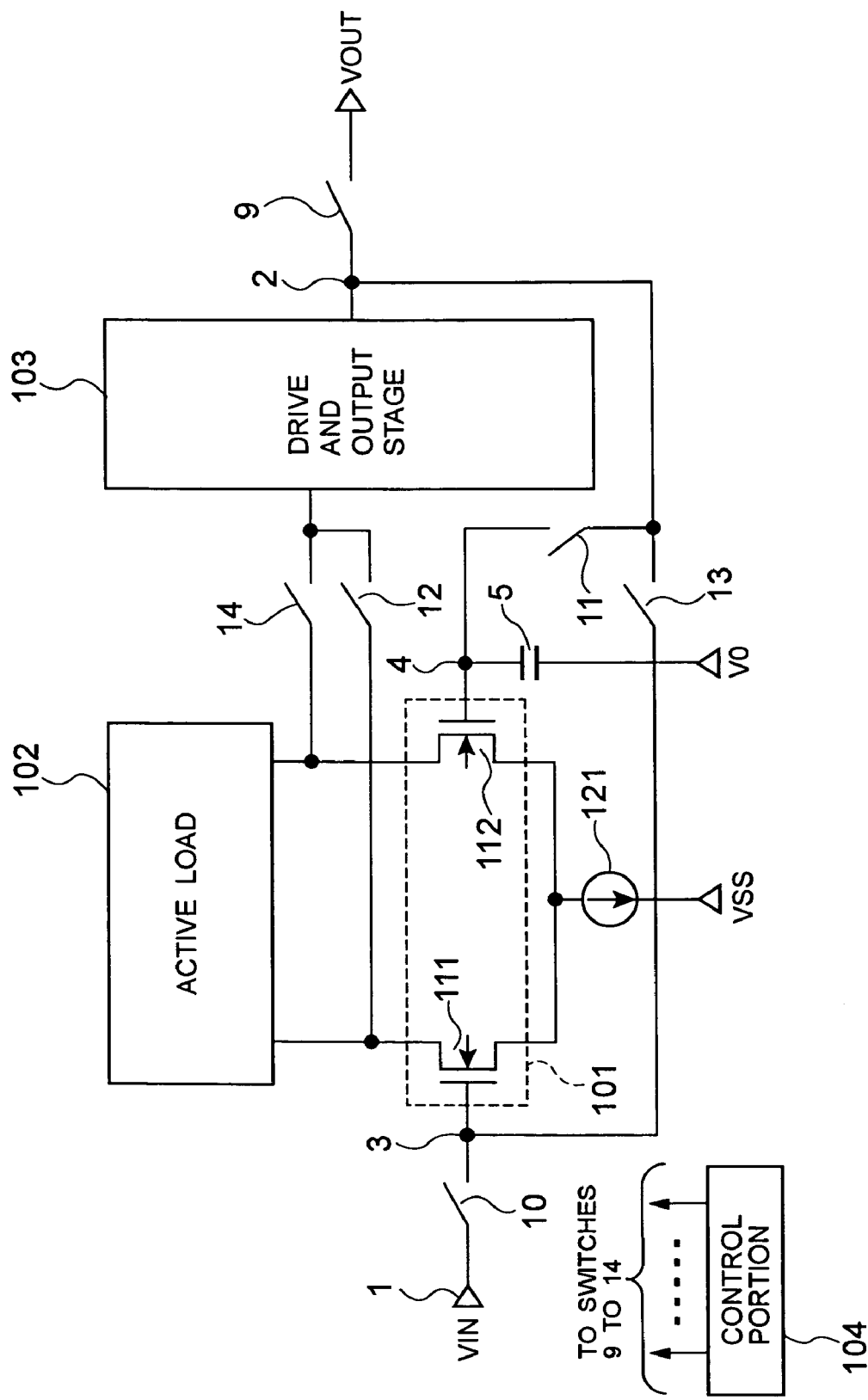
FIG. 9 is a block diagram of the differential amplifier circuit of a fourth embodiment of the present invention.
Figure 10:
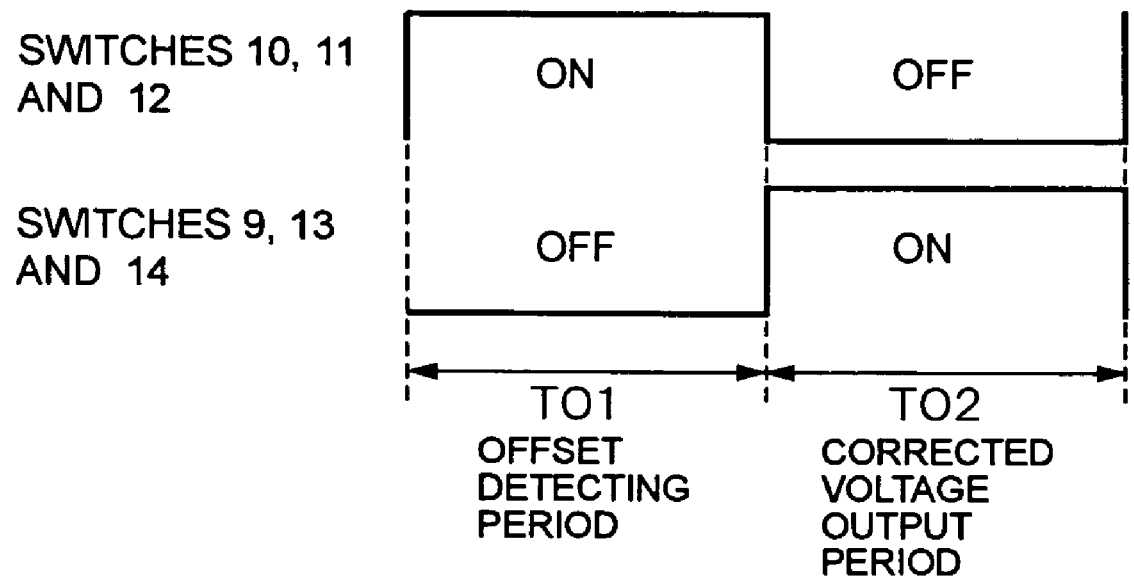
FIG. 10 is a timing chart of switches for the operation of the differential amplifier circuit of FIG. 9.

Next, a fourth embodiment of the present invention will be described. FIG. 9 shows a configuration of the differential amplifier circuit according to the fourth embodiment of the present invention. The differential amplifier circuit according to the fourth embodiment shown in FIG. 9 is added with a switch 9 between an output terminal 2 of the differential amplifier circuit and a load (not shown) for the circuit shown in FIG. 1. FIG. 10 is a timing chart for explaining the operation of the differential amplifier circuit according to the present embodiment. Referring to FIG. 10, with respect to switches 10 to 16, similarly to the differential amplifier circuit of FIG. 1, the switches 10 to 12 are changed to ON and the switches 13, 14 are changed to OFF in an offset detecting period T01, and the switches 10 to 12 are changed to OFF and the switches 13, 14 are changed to ON in a corrected voltage output period T02. A newly added switch 9 is turned OFF in the offset detecting period T01, and is changed to ON in the corrected voltage output period T02.

With respect to the differential amplifier circuit of FIG. 1, when a large capacity load is driven, it is necessary to set the period T01 to a sufficiently long period in which the output of the differential amplifier circuit is stabilized. On the other hand, with respect to the differential amplifier circuit shown in FIG. 9, since the switch 9 becomes OFF in the period T01, the differential amplifier circuit and the load are separated, and an actual load of the differential amplifier circuit in the period T01 is only the capacity element 5. Consequently, the differential amplifier circuit of FIG. 9 can stabilize the output in a shorter period than the differential amplifier circuit of FIG. 1 in the period T01. From the above, when a large capacity load is driven, it is possible to make the period T01 shorter than the differential amplifier circuit of FIG. 1, thereby enabling one output period to be shortened.

In the present embodiment, while the configuration provided with the switch 9 in the differential amplifier circuit according to the first embodiment shown in FIG. 1 has been described, it is possible to realize the same effect by providing a switch to connect the output terminal of the differential amplifier circuit and the load even in the differential amplifier circuit of other embodiments.

[Fifth Embodiment]

Figure 11:
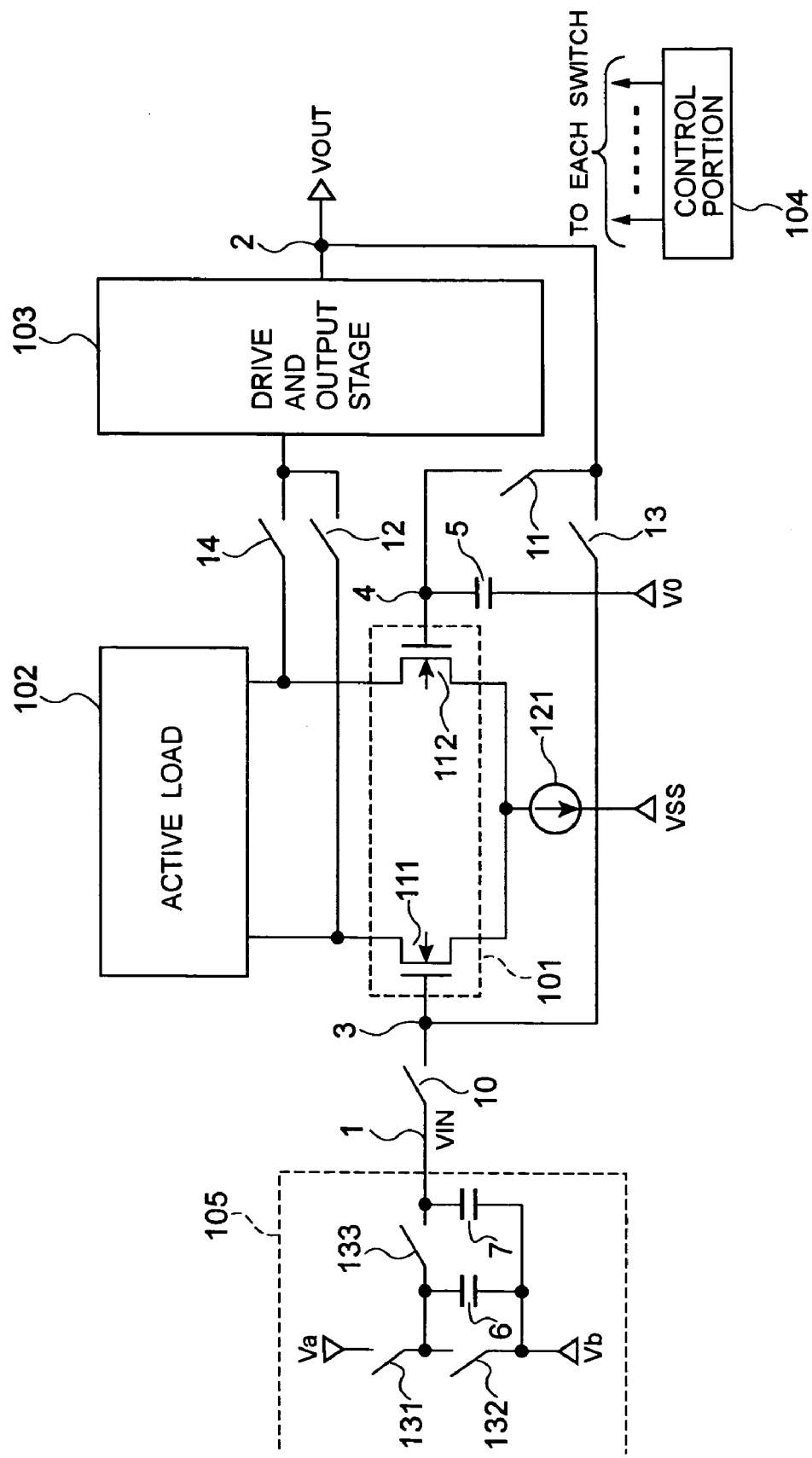
FIG. 11 is a block diagram of the differential amplifier circuit of a fifth embodiment of the present invention.

Next, a differential amplifier circuit according to a fifth embodiment of the present invention will be described. FIG. 11 shows a configuration of the differential amplifier circuit according to the fifth embodiment of the present invention. In the differential amplifier circuit according to the fifth embodiment shown in FIG. 11, a charge redistribution type D/A converter 105 is used in the input portion of the differential amplifier circuit for the circuit shown in FIG. 1, and the voltage after D/A conversion is inputted to the differential amplifier circuit as an input voltage VIN.

The charge redistribution type D/A converter 105 consists of two capacity elements 6 and 7 having an equal capacity value and switches 131 to 133, and one end each of the capacity elements 6 and 7 are connected through the switch 133, and the other end each are commonly connected to a reference potential Vb. Further, one end each of the capacity element 6 are connected to reference potentials Va and Vb, respectively through the switch 131 and the switch 132. A control portion 104 is for controlling these switches.

Next, the operation of the charge redistribution type D/A converter 105 will be described. In the charge redistribution type D/A converter 105, first, the switch 131 is turned OFF, and the switches 132 and 133 are turned ON, and the capacity elements 6 and 7 are reset by the reference potential Vb. Next, when the least significant bit of a digital data signal is 1 (0), the switch 131 (132) is turned ON, and the switch 132 (131) is turned OFF, and the switch 133 is turned OFF, and the capacity element 6 is charged by the reference potential Va (Vb), and after that, the switch 131 (132) is turned OFF. Next, the switch 133 is turned ON, and the redistribution of the charge is performed between the capacity elements 6 and 7, and after that, the switch 133 is turned OFF. The repetition of the redistribution of the charge between these two capacity elements up to the most significant bit of the digital data allows the input voltage VIN to generate from the digital signal.

Figure 20:
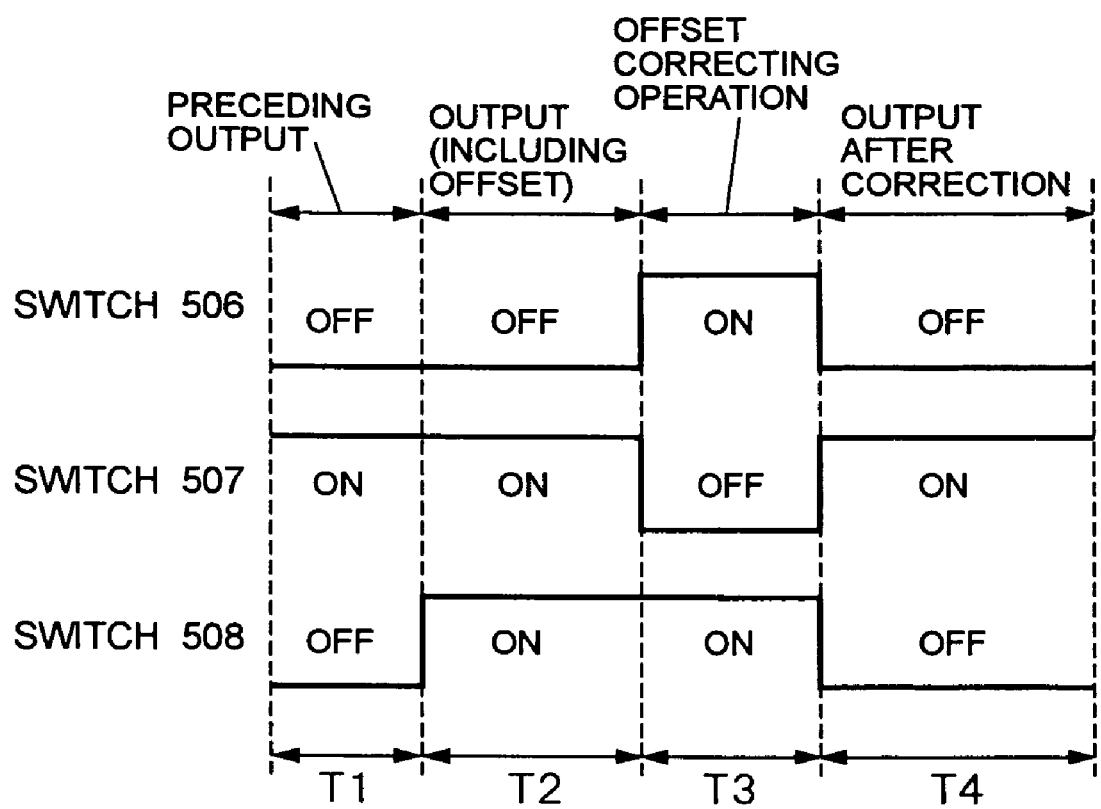
FIG. 20 is a timing chart for showing the operation of the differential amplifier circuit of the first conventional example.
Figure 21:
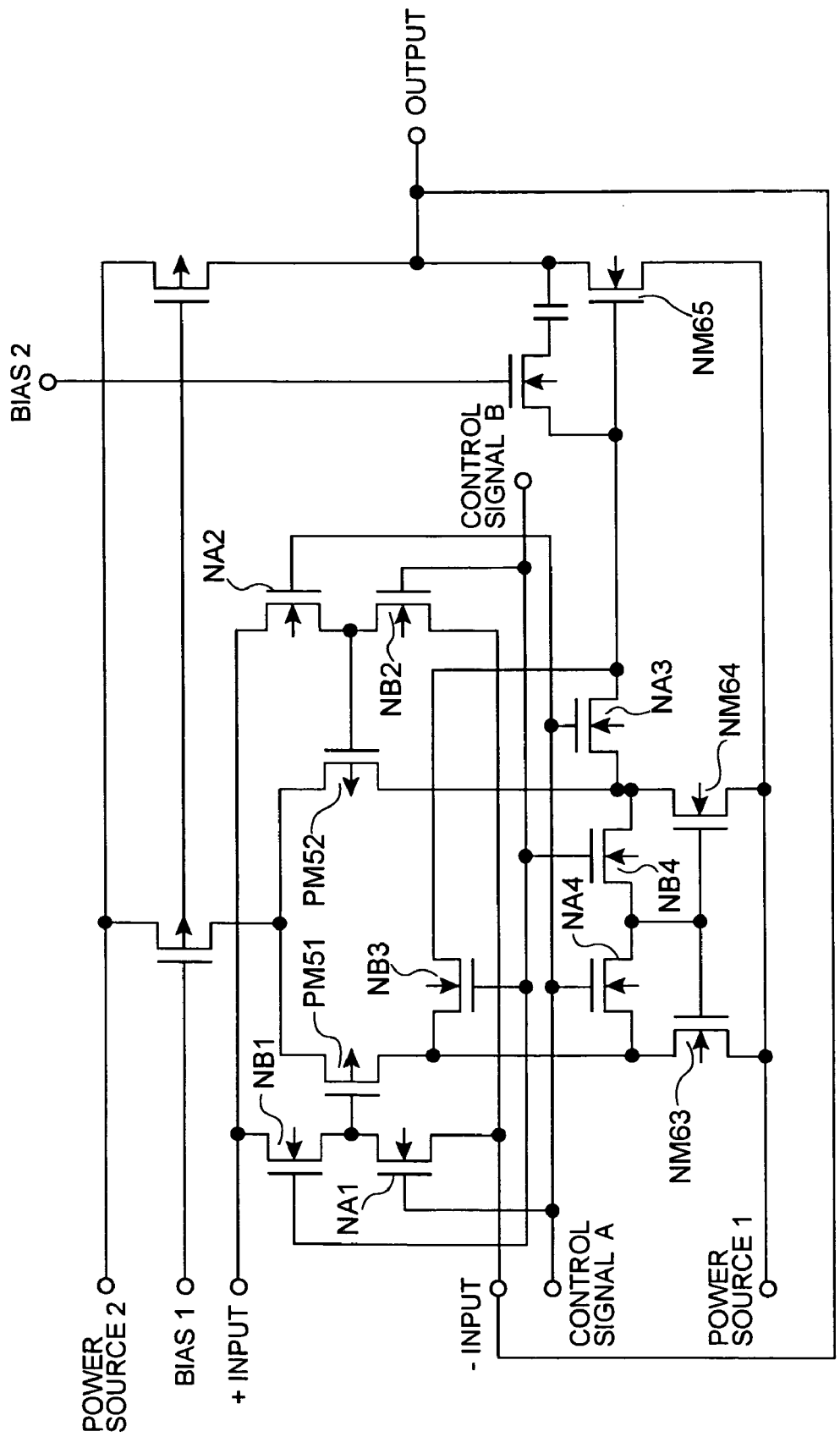
FIG. 21 is a block diagram of a low voltage amplifier circuit of a second conventional example.
Figure 22:
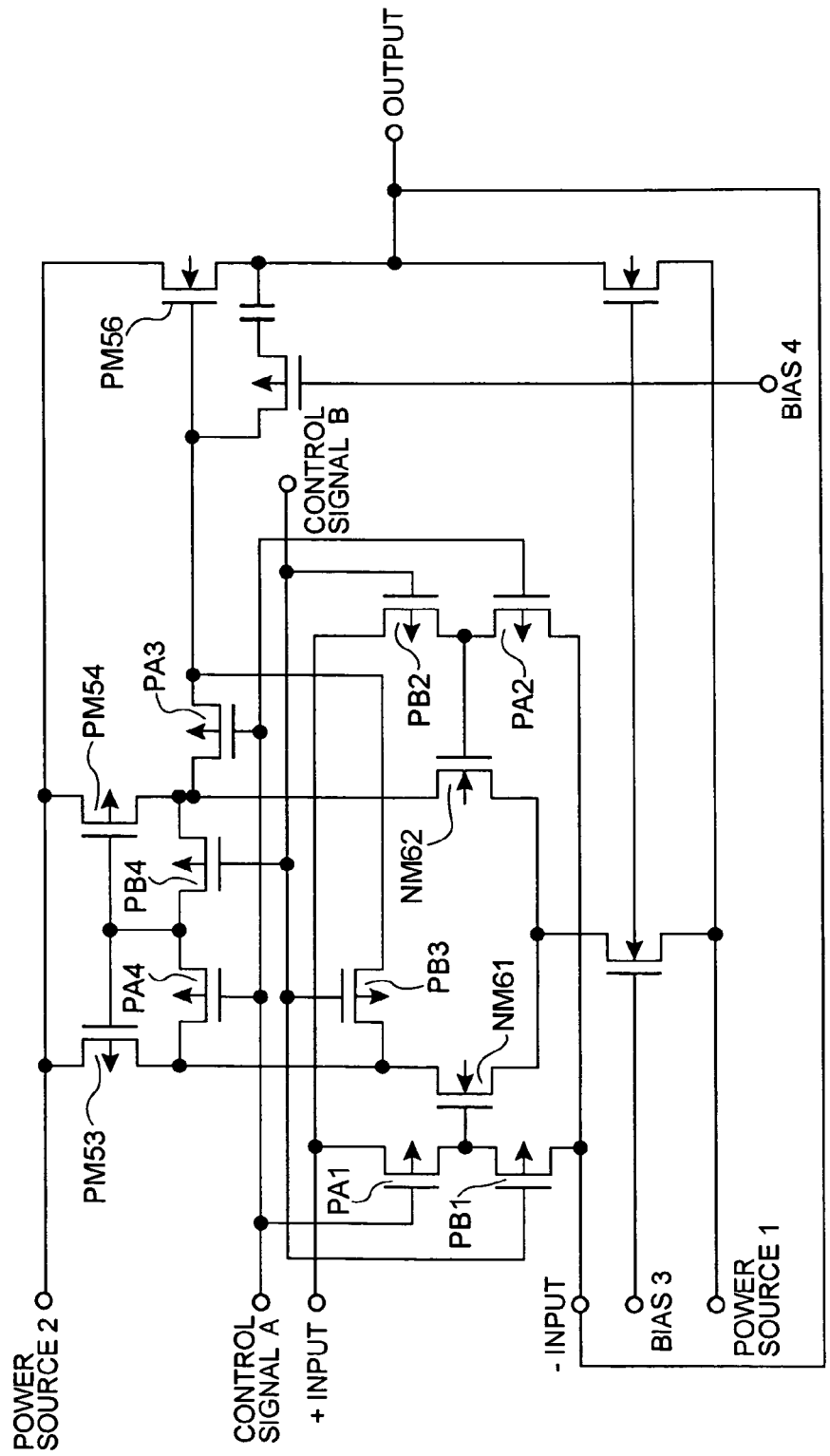
FIG. 22 is a block diagram of the high voltage amplifier circuit of the second conventional example.
Figure 23:
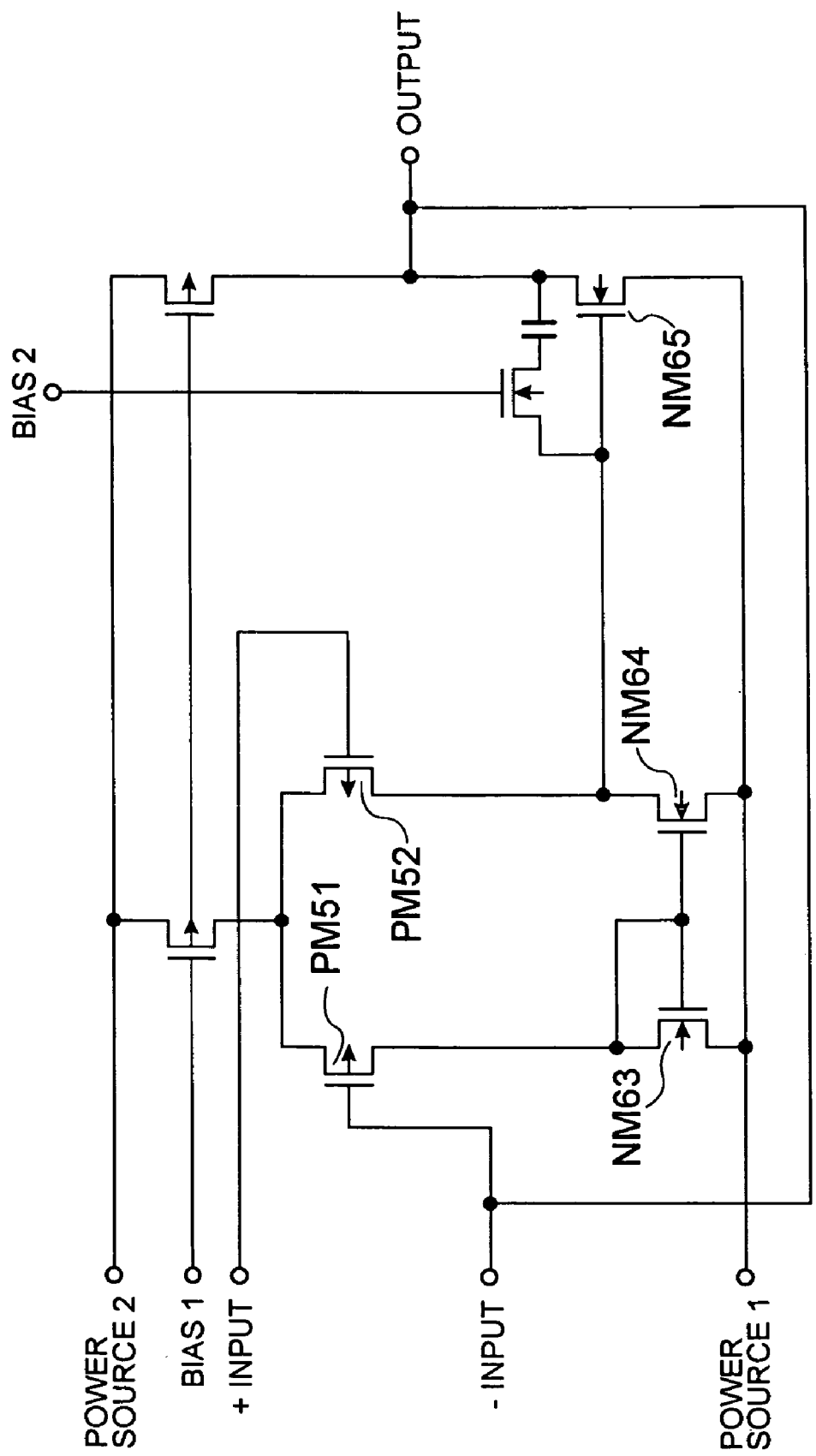
FIG. 23 is a circuit diagram of a circuit configuration where a control signal (A) is at an H level in the low voltage amplifier circuit of the second conventional example.
Figure 24:
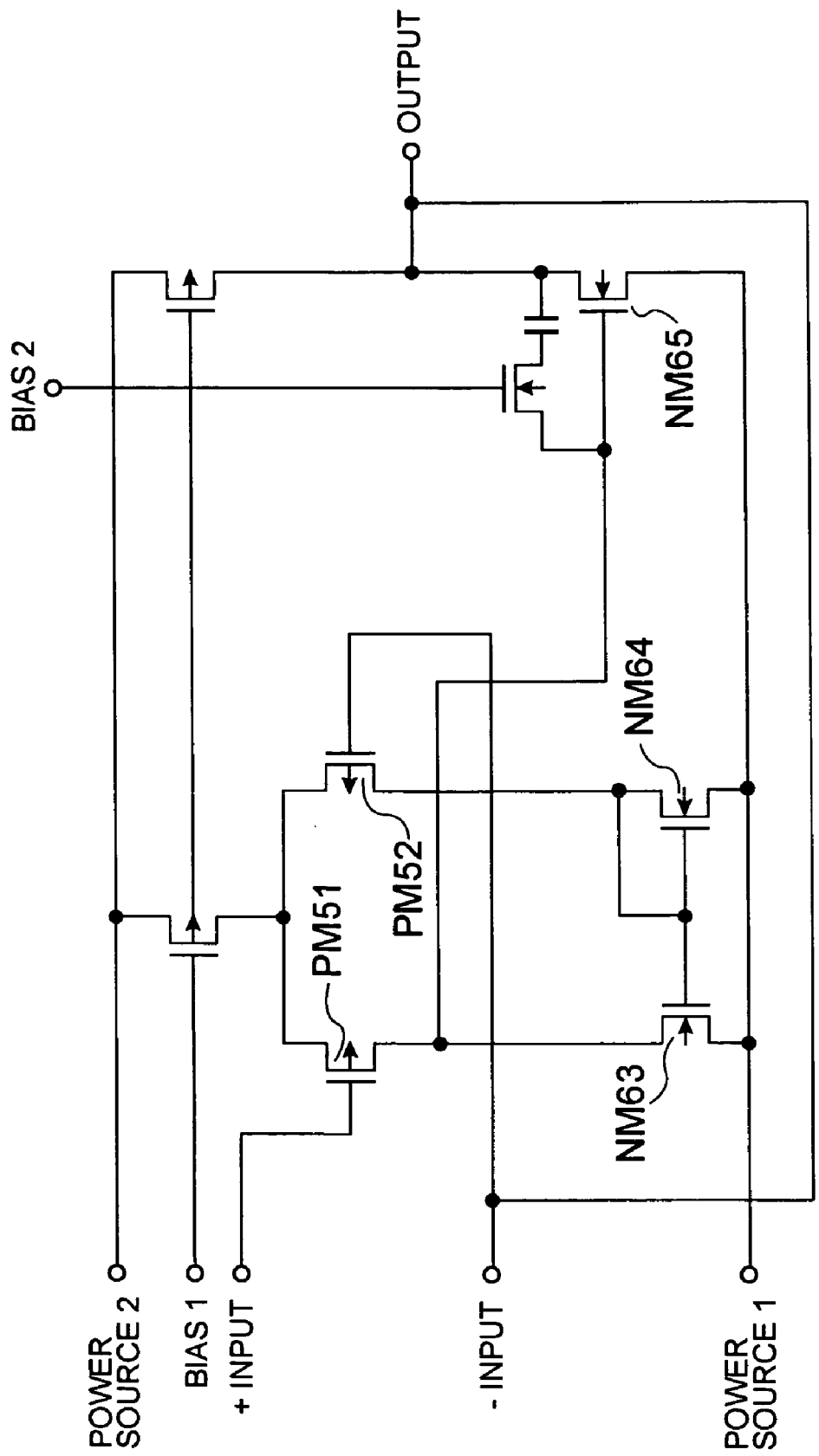
FIG. 24 is a circuit diagram of a circuit configuration where a control signal (B) is at an H level in the low voltage amplifier circuit of the second conventional example.

Next, the difference arisen from using the charge redistribution type D/A converter 105 for the input portions of the differential amplifier circuits of the present embodiment and the first conventional example of FIG. 19 will be described. When the charge redistribution type D/A converter 105 is used for the input portion of the differential amplifier circuit of the conventional example of FIG. 19, referring to FIG. 20, it is necessary that, subsequent to the period T1 in which the preceding output is performed, a period in which a D/A conversion is performed is provided, and after the D/A conversion, the operation of the period T2 is performed. On the other hand, in the present embodiment, since the input voltage VIN is supplied to the differential amplifier circuit only in the offset detecting period T01, it is possible to perform the generation of the input voltage VIN of the next output period by the D/A conversion by the charge redistribution type D/A converter 105 in the corrected voltage output period T02, and therefore, there is no need to additionally provide a period for performing the D/A conversion, and the speeding up of the data processing faster than the differential amplifier circuit of the first conventional example can be attempted.

EXAMPLE 1

Figure 12:
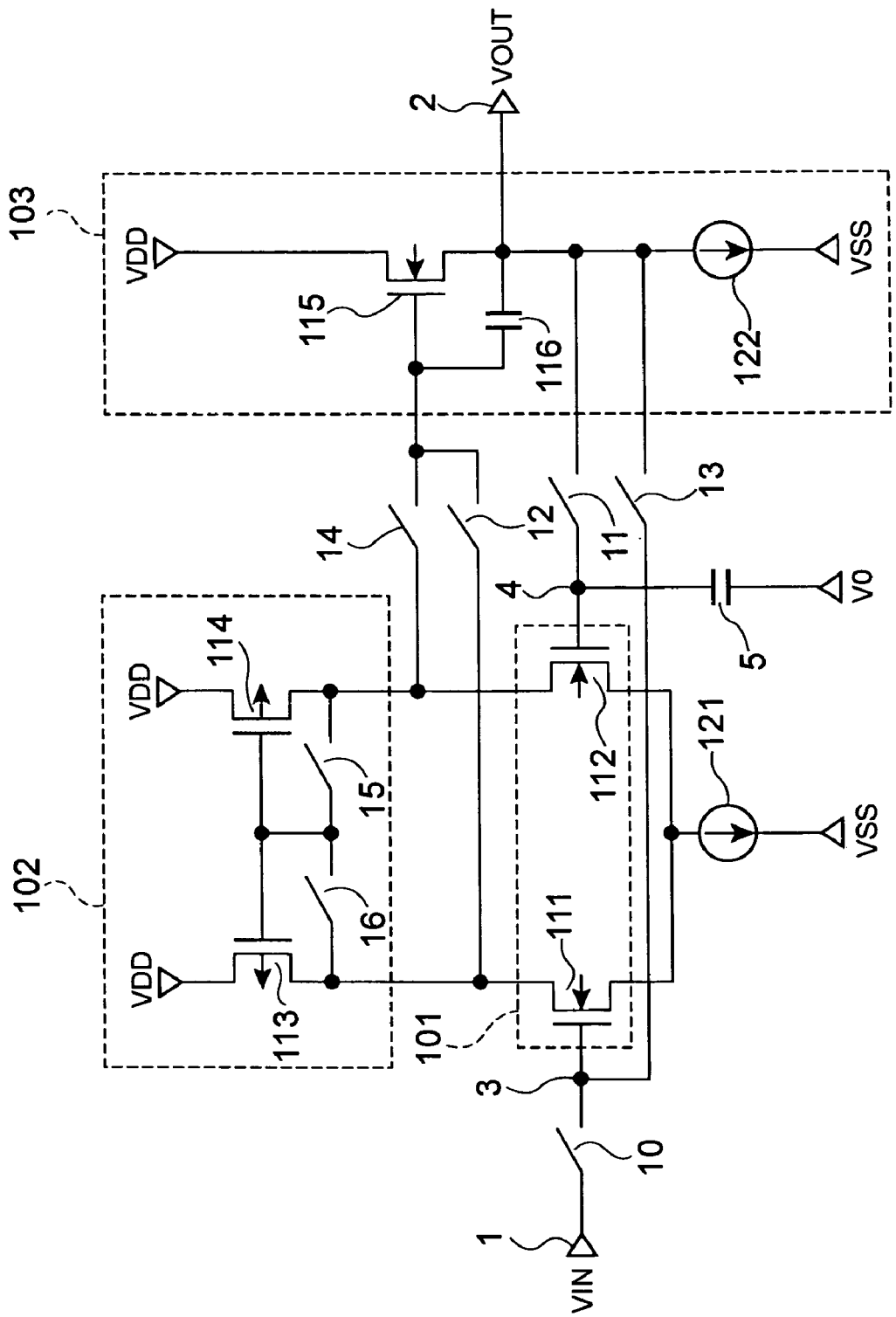
FIG. 12 is a block diagram of the differential amplifier circuit of the first embodiment of the present invention.

To describe the above-described embodiments more in detail, the embodiments of the present invention will be described below with reference to drawings. Note that the same reference numerals will be attached to those having the same functions as the drawings shown in the description of the embodiments of the present invention, and the detailed description thereof will be omitted. FIG. 12 shows the differential amplifier circuit of the first embodiment of the present invention. The differential amplifier circuit of FIG. 12 shows a concrete example of the differential amplifier circuit of the first embodiment of the present invention of FIG. 1, wherein a feedback type operational amplifier circuit having a NMOS differential input portion is added with switches 10 to 16 for changing a non-inverting input terminal for an inverting input terminal, and a capacity element 5.

Referring to FIG. 12, the differential amplifier circuit of the first embodiment of the present invention comprises: a differential input portion 101 comprising input transistors 111 and 112 with sources thereof commonly connected to each other; a constant power source 121 connected between the sources commonly connected to each other of the input transistors 111 and 112 and a low order power source VSS; a transistor 113, the source of which is connected to a high order power source VDD, and a drain of which is connected to a drain of the input transistor 111; a transistor 114, the source of which is connected to a high order power source VDD, a gate of which is connected a gate of the transistor 113, and the drain of which is connected to a drain of the input transistor 112; switches 15 and 16 connecting the gates commonly connected to each other of the transistors 113 and 114 to a drain of the transistor 114 or the transistor 113; a switch 10 connecting an input terminal 1 to a gate of the input transistor 111; and a capacity element 5 connected between a gate of the input transistor 112 and a power source VO (VO is an arbitrary power source).

The differential amplifier circuit further comprises: an output transistor 115, a source of which is connected to a high order power source VDD, and a drain of which is connected to an output terminal 2; a switch 11 connecting the output terminal 2 and the gate of the input transistor 112; a switch 13 connecting the output terminal 2 and the gate of the input transistor 111; switches 12 and 14 connecting a gate of the output transistor 115 and the drain of the input transistor 111 or the input transistor 112, a constant current source 122 connected between the output terminal 2 and a low order power source VSS, a phase compensation capacity 116 connected to the output terminal 2 and the gate of the output transistor 115.

Figure 13:
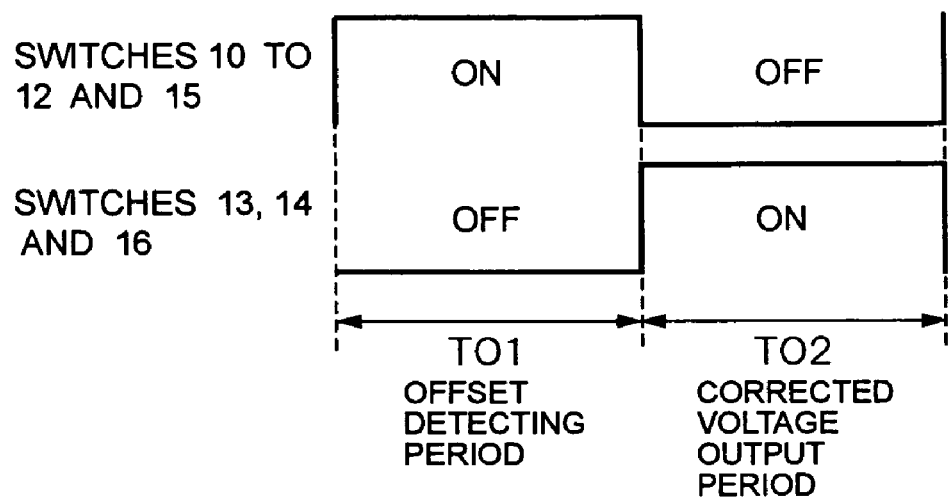
FIG. 13 is a timing chart of switches for showing the operation of the differential amplifier circuit of FIG. 12.
Figure 14:
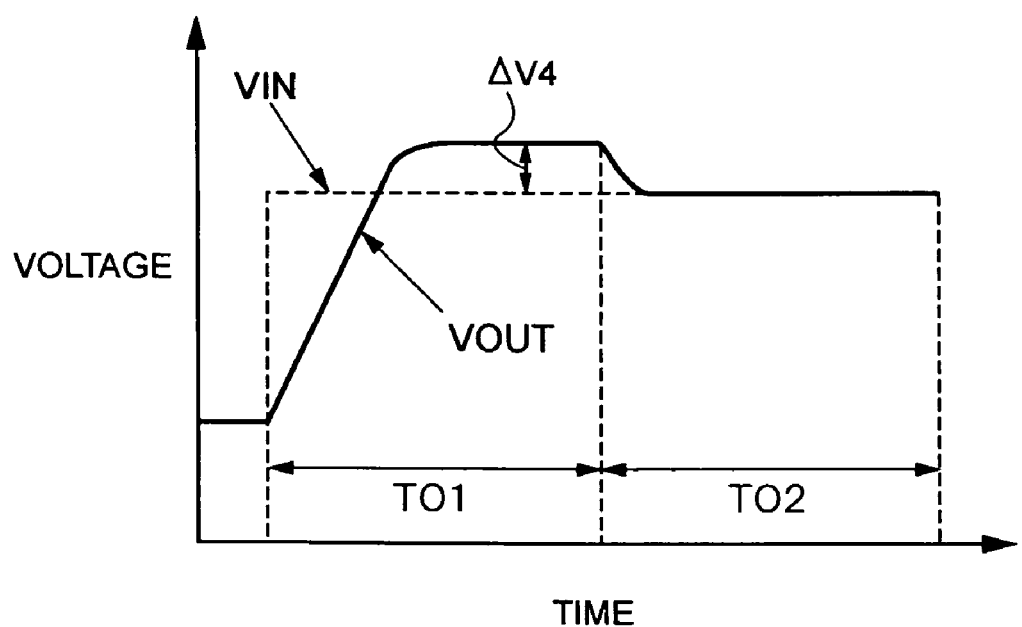
FIG. 14 is an output voltage waveform example of the differential amplifier circuit of FIG. 12.

Next, the operation of the differential amplifier circuit shown in FIG. 12 will be described. FIG. 13 is a timing chart for explaining the operation of the differential amplifier circuit according to the first embodiment. Further, FIG. 14 shows an output voltage waveform by the operation according to the timing chart of FIG. 13.

Referring to FIG. 13, in an offset detecting period T01, the switches 10 to 12 and 15 are turned ON, and the switches 13, 14 and 16 are turned OFF. In this way, the input terminal 1 is connected to the gate (terminal 3) of the input transistor 111, the output terminal 2 is connected to the gate (terminal 4) of the input transistor 112, and the gates commonly connected to each other of the transistors 113 and 114 are connected to a drain of the transistor 114, and the gate of the output transistor 115 is connected to a drain of the transistor 113. At this time, the terminals 3 and 4 become a non-inverting input terminal and an inverting input terminal, respectively, and the capacity element 5 connected to the terminal 4 is charged by the voltage added with an offset.

Next, in a corrected voltage output period T02, the switches 10 to 12 and 15 are changed to OFF, and at the same time, the switches 13, 14 and 16 are changed to ON. In this way, the output terminal 2 is connected to the gate (terminal 3) of the input transistor 111, and the gates commonly connected to each other of the transistors 113 and 114 are connected to the drain of the transistor 113, and the gate of the output transistor 115 is connected to the drain of the transistor 114, and the terminals 3 and 4 become the inverting input terminal and the non-inverting input terminal, respectively. In the period T02, since the switch 11 is turned OFF, the voltage of the terminal 4 becomes the voltage (=VIN+ΔV4) held in the capacity element 5 in the period T01. When the output offset in T01 is ΔV4 (output voltage VOUT=VIN+ΔV4) for the input voltage VIN, the output offset in T02 becomes $-\Delta V4$ for the voltage of the terminal 4, and therefore, the output voltage in T02 becomes equal to the input voltage VIN.

As described above, in the differential amplifier circuit of the first embodiment of the present invention, the change is made such that the terminals 3 and 4 are taken as the non-inverting input terminal and the inverting input terminal, respectively in the offset detecting period T01, and the terminals 3 and 4 are taken as the inverting input terminal and the non-inverting input terminal, respectively in the corrected voltage output period T02. Further, the output voltage at the time of applying the input voltage VIN to the terminal 3 in the period T01 is stored in the capacity element, and the voltage stored in the capacity element 5 in the period T01 is used as the voltage of the terminal 4 in the period T02. In this way, when the output offset in T01 is $\Delta V4$ for the voltage (input voltage VIN) of the terminal 3, the output offset in T02 becomes $-\Delta V4$ for the voltage (=VIN+$\Delta V4$) of the terminal 4, and therefore, the output voltage equal to the input voltage VIN can be obtained in T02.

Figure 17:
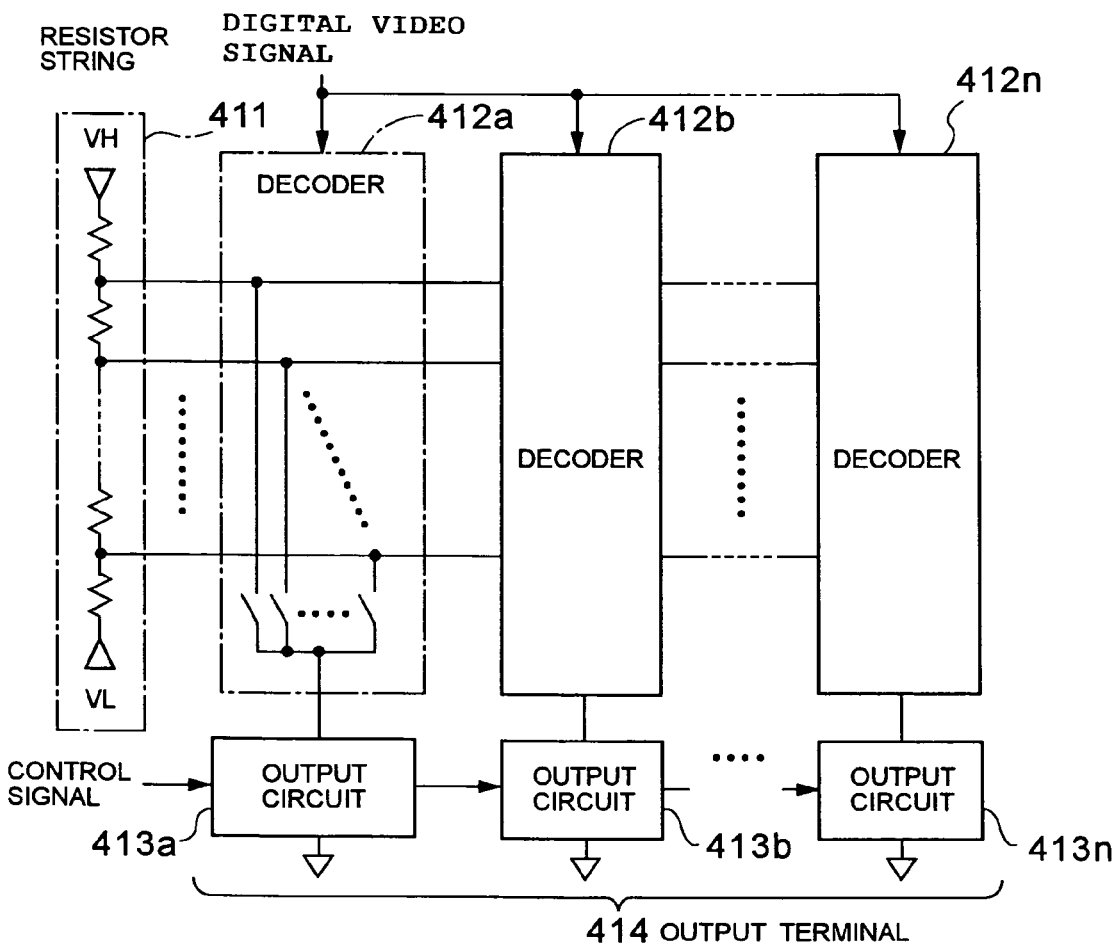
FIG. 17 is a block diagram of a first application of the present invention.

Further, since the input voltage VIN is connected only to the gate of the input transistor in the period T01, similarly to the differential amplifier circuit of the conventional example of FIG. 17, the input voltage VIN is not affected by the output, and a highly accurate output voltage corrected in the offset can be obtained regardless of the current supply capacity of the input voltage VIN.

EXAMPLE 2

Figure 15:
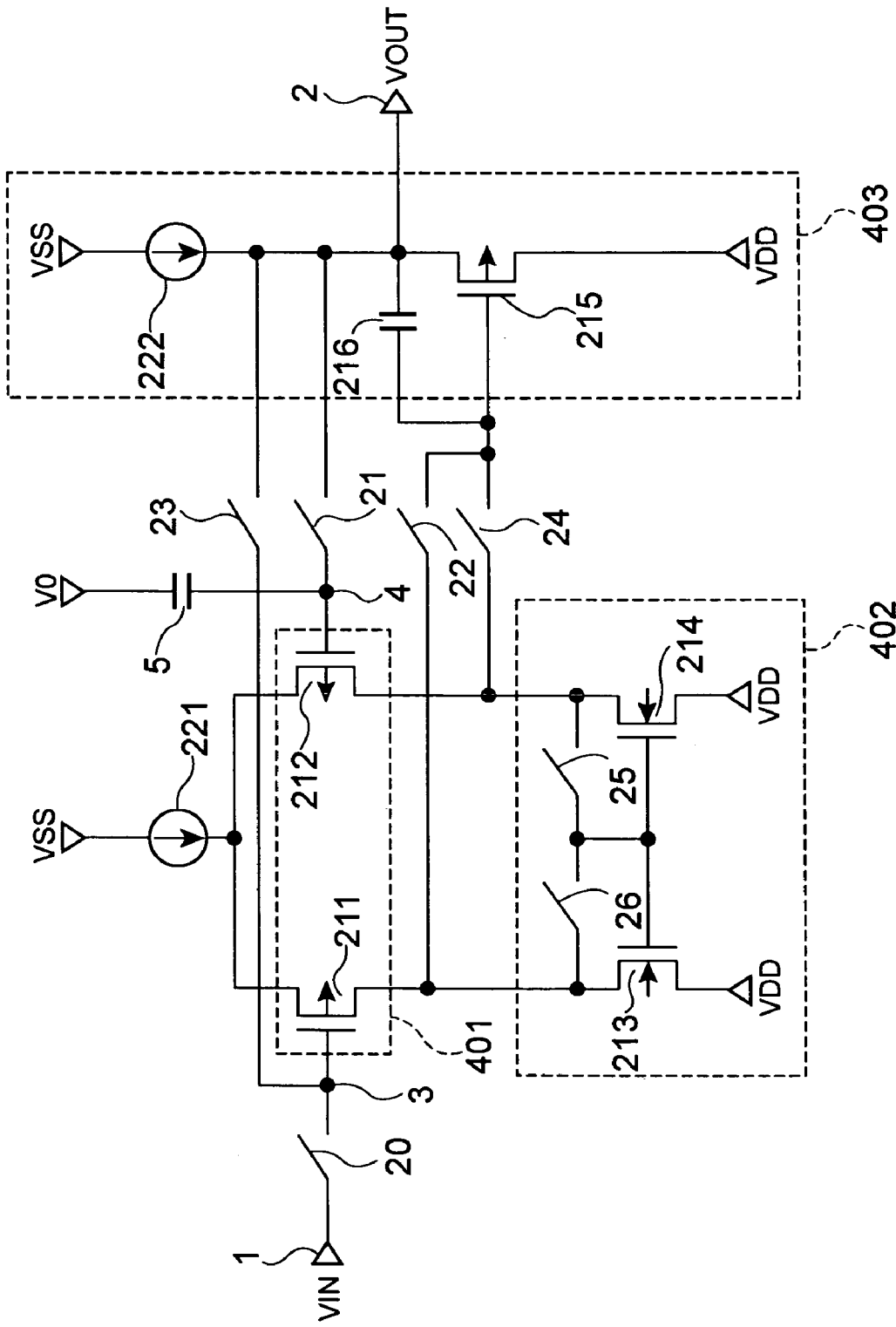
FIG. 15 is a block diagram of the differential amplifier circuit of the second embodiment of the present invention.

FIG. 15 shows a configuration of the second embodiment of the present invention. The differential amplifier circuit of FIG. 15 is a drawing showing a concrete example of the differential amplifier circuit of the second embodiment of the present invention of FIG. 5, and has a feedback type operational amplifier circuit having a PMOS differential input portion. The differential amplifier circuit comprises switches 20 to 26 for changing a non-inverting input terminal for an inverting input terminal, and a capacity element 5.

Referring to FIG. 15, the differential amplifier circuit of the second embodiment of the present invention comprises: a differential input portion 201 comprising input transistors 211 and 212 with sources thereof commonly connected to each other; a constant current source 221 connected between the sources commonly connected to each other of the input transistors 211 and 212 and a high order power source VDD; a transistor 213, the source of which is connected to a low order power source VSS, and a drain of which is connected to the drain of the input transistor 211; a transistor 214, a source of which is connected to the low order power source VSS, and a gate of which is connected to a gate of the transistor 213, a drain of which is connected to a drain of the input transistor 212; switches 25 and 26 for connecting the gates commonly connected to each other of transistors 213 and 214 to a drain of the transistor 214 or the transistor 213; a switch 10 for connecting the input terminal 1 to a gate of the input transistor 211; and a capacity element 5 connected between a gate of the input transistor 212 and a power source VO (VO is an arbitrary power source).

The differential amplifier circuit further comprises: an output transistor 215, a source of which is connected to a low order power source VSS, and a drain of which is connected to an output terminal 2; a switch 21 connecting the output terminal 2 and the gate of the input transistor 212; a switch 23 for connecting the output terminal 2 and the gate of the input transistor 211; switches 22 and 24 for connecting a gate of the output transistor 215 to the drain of the input transistor 211 or the input transistor 212; a constant current source 222 connected to the output terminal 2 and the high order power source VDD; and a phase compensation capacity element 216 connected the output terminal 2 and the gate of the output transistor 215.

Figure 16:
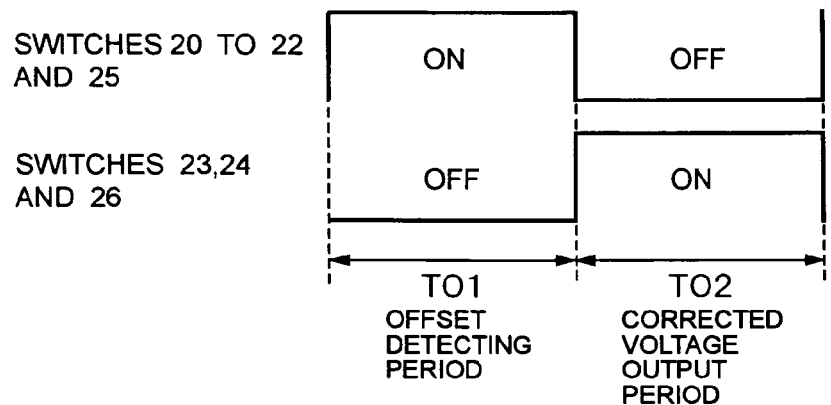
FIG. 16 is a timing chart of switches for showing the operation of the differential amplifier circuit of FIG. 14.

Next, the operation of the differential amplifier circuit shown in FIG. 15 will be described. FIG. 16 is a timing chart explaining the operation of the differential amplifier circuit according to the second embodiment. Referring to FIG. 16, in the offset detecting period T01, the switches 20 to 22 and 25 are turned ON, and the switches 23, 24 and 26 are turned OFF. In this way, an input terminal 1 is connected to the gate (terminal 3) of the input transistor 211, and the output terminal 2 is connected to the gate (terminal 4) of the input transistor 212, and the gates of the transistors 213 and 214 are connected to the drain of the transistor 214, and the gate of the output transistor 215 is connected to the drain of the transistor 213. At this time, the terminals 3 and 4 become the non-inverting input terminal and the inverting input terminal, respectively, and the capacity element 5 connected to the terminal 4 is charged by the voltage added with the offset.

Next, in the corrected voltage output period T02, the switches 20 to 22 and 25 are changed to OFF, and at the same time, switches 23, 24 and 26 are changed to ON. In this way, the output terminal 2 is connected to the gate (terminal 3) of the input transistor 211, and the gates of the transistors 213 and 214 are connected to the drain of the transistor 213, and the gate of the output transistor 215 is connected to the drain of the transistor 214, and the terminals 3 and 4 become the inverting input terminal and the non-inverting input terminal, respectively. In the period T02, a switch 11 becomes OFF, and therefore, the voltage of the terminal 4 becomes the voltage (=VIN+$\Delta V5$) held in the capacity element 5 in the period T01. When the output offset in the period T01 is $\Delta V5$ (output voltage VOUT=VIN+$\Delta V5$) for the input voltage, the output offset in T02 becomes $-\Delta V5$ for the voltage of the terminal 4, and therefore, the output voltage in T02 becomes equal to the input voltage VIN.

As described above, even in the differential amplifier circuit in the second embodiment of the present invention, similarly to the differential amplifier circuit of FIG. 12, a change is made such that the terminals 3 and 4 are taken as a non-inverting input terminal and an inverting input terminal, respectively in the offset detecting period T01, and the terminals 3 and 4 are taken as an inverting input terminal and a non-inverting input terminal, respectively in the corrected voltage output period T02. Further, the output voltage at the time of applying the input voltage VIN to the terminal 3 in the period T01 is stored in the capacity element, and the voltage stored in the capacity element 5 in the period T01 is used as the voltage of the terminal 4 in the period T02. In this way, when the output offset in T01 is $\Delta V5$ for the voltage (input voltage VIN) of the terminal 3, the output offset in T02 becomes $-\Delta V5$ for the voltage (=VIN+$\Delta V5$) of the terminal 4, and therefore, the output voltage equal to the input voltage VIN can be obtained in T02.

Further, since the input voltage VIN is connected only to the gate of the input transistor in the period T01, it is possible to correct the offset of the differential amplifier circuit even when the current supply capacity of the input voltage VIN is small, and a highly accurate output voltage can be obtained.

[Application 1]

Next, the fifth embodiment of the present invention will be described. FIG. 17 is a block diagram for explaining a first application of the present invention. In this application, an example adapting the differential amplifier circuit of the present invention to a multi-output drive circuit used in an active matrix type display is shown. Referring to FIG. 17, the drive circuit of the active matrix type display unit is configured such that, from among a plurality of gradation voltages generated from each terminal (tap) of a resistor string 411 provided between reference voltages VH and VL, the gradation voltage is selected for every output at decoders 412a to 412n according to digital video signals, and is amplified at output circuits 413a to 413n, thereby driving the data line connected to an output terminal 414. The control signal controls the switches of the differential amplifier circuit of the present invention configuring output circuits 413a to 413n.

The differential amplifier circuit of the present invention can be used as the output circuits 413a to 413n shown in FIG. 17. The output circuits 413a to 413n using differential amplifier circuit of the present invention can drive the data line by highly accurate voltage regardless of the current supply capacity of the gradation voltage selected and inputted from the decoders 412a to 412n.

[Application 2]

Figure 18:
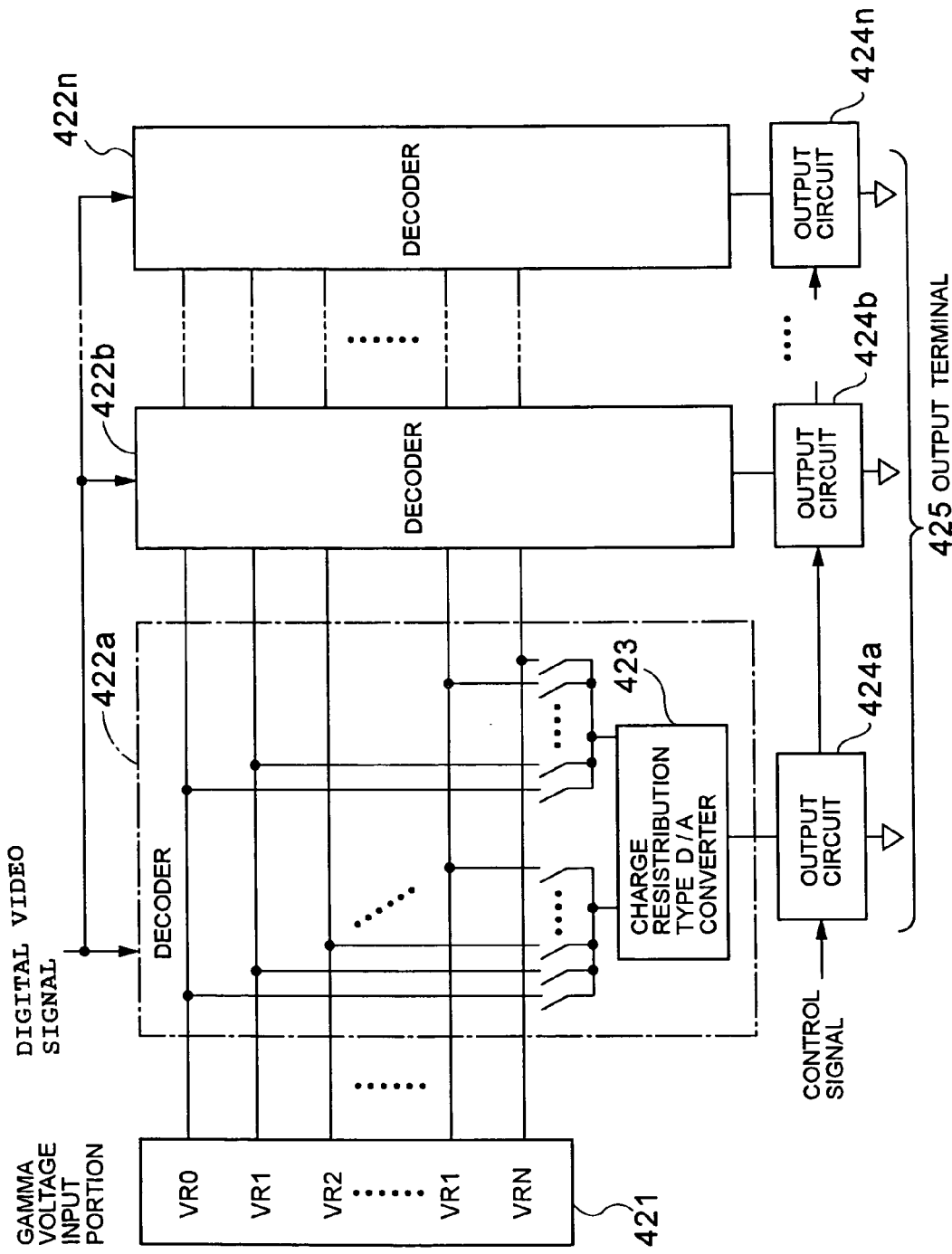
FIG. 18 is a block diagram of a second application of the present invention.

Next, a second application of the present invention will be described. FIG. 18 is a block diagram for describing the application. This application shows a case of using the resistor string as gradation voltage generating means of the multi-output drive circuit used in the active matrix type display unit. In this application, an example is shown where the differential amplifier circuit of the present invention is adapted to the drive circuit using the charge redistribution type D/A converter as the gradation voltage generating means of the multi-output drive circuit used in the active matrix display unit.

Referring to FIG. 18, the drive circuit of the active matrix type display of the present application is configured such that, from among gamma voltages VR1 to VRN corresponding to transmittance-voltage characteristic of a liquid crystal inputted in decoders 422a to 422n from a gamma voltage input portion 421 per every output, two adjacent gamma voltages according to a digital video signal are inputted to a charge redistribution type D/A converter 423. The charge redistribution type D/A converter 423 generates the gradation voltage according to the digital video signal from the two inputted gamma voltages, and amplifies it at output circuits 424a to 424n, thereby driving the data line connected to an output terminal 425. A control signal controls the switches of the differential amplifier circuit of the present invention configuring the output circuits 424a to 424n.

The differential amplifier circuit of the present invention can be used as the output circuits 424a to 424n shown in FIG. 18. While the voltage generated from the charge redistribution type D/A converter 423 has no current supply capacity, the output circuits 424a to 424n using the differential amplifier circuit of the present invention can drive the data line by highly accurate voltage regardless of the current supply capacity of the input voltage.

According to the present invention, there is an advantage in that the offset detecting operation is performed in the first state without the input voltage connected to the capacity, and the offset correcting operation is performed in the second state, and therefore, even when the current supply capacity of the input is small, a highly accurate amplification output which is removed from the offset can be obtained.

What is claimed is:

1. A differential amplifier circuit, including:
    differential amplifier means having first and second input terminals and an output terminal;
    a capacity element, one end of which is connected to a predetermined power source terminal, and the other end of which is connected to said second input terminal; and
    control means for controlling switching between a first state wherein said first input terminal is taken as a non-inverting input terminal, and at same time, said second input terminal is taken as an inverting input terminal, and moreover, an input voltage is supplied to said first input terminal, and at same time, said second input terminal is connected to said output terminal, and a second state wherein said first input terminal is taken as the inverting input terminal, and at same time, said second input terminal is taken as the non-inverting input terminal, and moreover, said first input terminal is connected to said output terminal.

2. The differential amplifier circuit according to claim 1, wherein a voltage amplifying an input voltage supplied to said first input terminal is stored in said capacity element in said first state, and the voltage amplifying the voltage stored in said capacity element to be supplied to said second input terminal is outputted to said output terminal in said second state.

3. The differential amplifier circuit according to claim 1, further including a switch provided between said output terminal and a load,
    wherein said control means turns said switch OFF in said first state.

4. A differential amplifier circuit, including:
    a circuit input terminal and a circuit output terminal;
    differential amplifier means having a pair of differential transistors comprising first and second transistors, a constant current source for driving said pair of differential transistors, an active load connected to an output pair of said pair of differential transistors, and an output circuit for outputting a signal to said circuit output terminal based on the signal of said output pair;
    first and second switches connecting one of the input pair of said pair of differential transistors and each of said circuit input terminal and said circuit output terminal;
    a third switch connecting the other of said input pair and said circuit output terminal;
    fourth and fifth switches connecting each of said output pair to said output circuit; and
    a capacity element, one end of which is connected to a predetermined power source terminal, and the other end of which is connected to the other of said input pair.

5. The differential amplifier circuit according to claim 4, further including control means for controlling the switching between the first state wherein said first, third and fourth switches are turned ON, and said second and fifth switches are turned OFF, and the second state wherein said first, third, and fourth switches are turned OFF, and said second and fifth switches are turned ON.

6. The differential amplifier circuit according to claim 5, wherein the voltage amplified based on the input voltage to be supplied to one of said input pair from said circuit input terminal is held in said capacity element in said first state, and the voltage amplified based on the voltage held in said capacity element to be supplied to the other of said input pair is outputted to said circuit output terminal in said second state.

7. The differential amplifier circuit according to claim 5, wherein said active load has a pair of transistors comprising third and fourth transistors with gates and sources thereof commonly connected, respectively, a sixth switch connecting the drain of said third transistor connected to one of said output pair and the gates of said transistor pair, and a seventh switch connecting the drain of said fourth transistor connected to the other of said output pair and the gates of said transistor pair, wherein said control means makes a control such that at least said sixth switch is turned OFF and said seventh switch is turned ON in said first state, and at least said sixth switch is turned ON and said seventh switch is turned OFF in said second state.

8. The differential amplifier circuit according to claim 5, further including a switch provided between said circuit output terminal and an output load, wherein said control means turns said switch OFF in said first state.

9. The differential amplifier circuit according to claim 1, further including means for generating an input voltage of the circuit in said first state, in said second state.

10. A drive circuit of a liquid crystal display unit, having a plurality of resistors connected in series between first and second reference voltages, and including gradation generating means for generating a gradation voltage from each tap derived from connecting points of said plurality of resistors, and decoding means for taking a digital signal as an input and selecting and outputting a voltage corresponding to the output voltage of said gradating generating means, and taking the output of said decode means as an input, and driving a plurality of data lines, respectively, said drive circuit comprising a plurality of differential amplifier circuits according to claim 1 corresponding to said plurality of data lines.

11. A drive circuit of a liquid crystal display unit, including: a plurality of respective reference voltage input terminals for inputting a plurality of reference voltages; decode means for selecting and outputting two adjacent reference voltages according to the digital video signal; and D/A converting means for interpolating and outputting an analog voltage of the intermediate level of two reference voltages selected by this decode means, and taking the output of said D/A converting means as an input, and driving a plurality of data lines, respectively, said drive circuit comprising a plurality of differential amplifier circuits according to claim 1 corresponding to a plurality of data lines.

* * * * *